(12) United States Patent
Arai

(10) Patent No.: US 10,755,958 B2
(45) Date of Patent: Aug. 25, 2020

(54) TRANSFER METHOD, MOUNTING METHOD, TRANSFER DEVICE, AND MOUNTING DEVICE

(71) Applicant: TORAY ENGINEERING CO., LTD., Tokyo (JP)

(72) Inventor: Yoshiyuki Arai, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 0 days.

(21) Appl. No.: 16/364,833

(22) Filed: Mar. 26, 2019

(65) Prior Publication Data

US 2019/0221466 A1 Jul. 18, 2019

Related U.S. Application Data

(63) Continuation of application No. PCT/JP2017/033809, filed on Sep. 20, 2017.

(30) Foreign Application Priority Data

Sep. 29, 2016 (JP) .................................. 2016-190507
Jan. 21, 2017 (JP) .................................. 2017-009029

(51) Int. Cl.
*H01L 21/00* (2006.01)
*H01L 21/683* (2006.01)
(Continued)

(52) U.S. Cl.
CPC .......... *H01L 21/6835* (2013.01); *H01L 24/16* (2013.01); *H01L 24/81* (2013.01); *H01L 25/0753* (2013.01); *H01L 33/62* (2013.01); *H01L 33/0095* (2013.01); *H01L 2221/6834* (2013.01); *H01L 2221/68327* (2013.01); *H01L 2221/68354* (2013.01); *H01L 2221/68368* (2013.01); *H01L 2221/68381* (2013.01);
(Continued)

(58) Field of Classification Search
None
See application file for complete search history.

(56) References Cited

U.S. PATENT DOCUMENTS

2013/0285086 A1 10/2013 Hu et al.

FOREIGN PATENT DOCUMENTS

JP 2003-51621 A 2/2003
JP 2004-207388 A 7/2004
(Continued)

OTHER PUBLICATIONS

International Search Report of the corresponding International Application No. PCT/JP2017/033809, dated Nov. 28, 2017.

*Primary Examiner* — Reema Patel
(74) *Attorney, Agent, or Firm* — Global IP Counselors, LLP

(57) ABSTRACT

A transfer method for transferring LED chips, a first surface of which is held on a transfer substrate, on a transfer-target substrate is provided that comprises disposing the transfer-target substrate such that the transfer-target substrate faces, across a gap, a second surface of the LED chips on an opposite side from the first surface of the LED chips, and transferring the LED chips on the transfer-target substrate by irradiating the transfer substrate with a laser light to separate the LED chips from the transfer substrate and by urging the LED chips toward the transfer-target substrate. At least the transferring of the LED chips to the transfer-target substrate being executed in a vacuum environment.

7 Claims, 20 Drawing Sheets

(51) Int. Cl.
    *H01L 25/075*        (2006.01)
    *H01L 33/62*         (2010.01)
    *H01L 23/00*         (2006.01)
    *H01L 33/00*         (2010.01)

(52) U.S. Cl.
    CPC ............ *H01L 2224/16225* (2013.01); *H01L 2224/81203* (2013.01); *H01L 2924/12041* (2013.01); *H01L 2933/0066* (2013.01)

(56) References Cited

FOREIGN PATENT DOCUMENTS

| | | |
|---|---|---|
| JP | 2006-140398 A | 6/2006 |
| JP | 2010-161221 A | 7/2010 |
| JP | 2015-157348 A | 9/2015 |

TRANSFER METHOD, MOUNTING METHOD, TRANSFER DEVICE, AND MOUNTING DEVICE

This application is a continuation application of PCT International Application No. PCT/JP2017/033809 filed on Sep. 20, 2017, which claims priority to Japanese Patent Application Nos. 2016-190507 filed on Sep. 29, 2016 and 2017-009029 filed on Jan. 21, 2017. The entire disclosures of PCT International Application No. PCT/JP2017/033809 and Japanese Patent Application Nos. 2016-190507 and 2017-009029 are hereby incorporated herein by reference.

BACKGROUND

Field of the Invention

The present invention relates to a transfer method, a mounting method, a transfer device, and a mounting device for transferring and mounting LED chips.

Background Information

In order to reduce the cost, LED chips have been made smaller, and efforts have been made to mount these smaller LED chips quickly and accurately. In particular, LEDs used for displays need for LED chips of 50×50 µm or smaller (called micro LEDs) to be mounted at high speed at an accuracy of just a few microns.

Japanese Patent Application Publication No. 2010-161221 (Patent Literature 1) discloses a configuration in which LED chips formed in a lattice shape on a wafer are irradiated with a band of laser light, and one or more lines of chips are transferred all at once to a transfer substrate, after which the LED chips transferred to the transfer substrate are irradiated with a band of laser light, and one or more lines are transferred all at once to a transfer substrate.

SUMMARY

However, a problem with the technique described in Patent Literature 1 was that the LED chips may be displaced due to the influence of air resistance when transferring the LED chips to the transfer substrates.

It is an object of the present invention to solve the above problem and to transfer and mount LED chips very accurately by eliminating the influence of air resistance during transfer.

In order to solve the above problem, the present invention provides a transfer method for transferring LED chips, a first surface of which is held on a transfer substrate, on a transfer-target substrate, the transfer method comprising: disposing the transfer-target substrate such that the transfer-target substrate faces, across a gap, a second surface of the LED chips on an opposite side from the first surface of the LED chips; and transferring the LED chips on the transfer-target substrate by irradiating the transfer substrate with a laser light to separate the LED chips from the transfer substrate and by urging the LED chips toward the transfer-target substrate, at least the transferring of the LED chips to the transfer-target substrate being executed in a vacuum environment.

With this configuration, the transferring of the LED chips to the transfer-target substrate in a vacuum environment eliminates the influence of air resistance during transfer and allows the LED chips to be transferred very accurately.

Also, to solve the above problem, the present invention provides a mounting method for mounting diced LED chips, a first surface of which is held on a carrier substrate, on a circuit board, the mounting method comprising: transferring the LED chips to a first transfer substrate by separating the LED chips from the carrier substrate such that a second surface of the LED on an opposite side from the first surface of the LED chips is held on the first transfer substrate; disposing a second transfer substrate such that the second transfer substrate faces, across a gap, the first surface of the LED chips while the second surface of the LED chips is held on the first transfer substrate; transferring a first surface side of the LED chips to the second transfer substrate by irradiating the first transfer substrate with a linear laser light to separate the LED chips line by line from the first transfer substrate, by urging the LED chips toward the second transfer substrate, and by moving the first transfer substrate and the second transfer substrate relative to each other at different speeds and in a direction perpendicular to the linear laser light; disposing the second transfer substrate by rotating the second transfer substrate by 90° around a normal line of the second transfer substrate with respect to the linear laser light; disposing the circuit board such that the circuit board faces, across a gap, the second surface of the LED chips while the first surface of the LED chips is held on the second transfer substrate; and transferring a second surface side of the LED chips to the circuit board such that bumps on the LED chips are joined to electrodes on the circuit board by irradiating the second transfer substrate with a linear laser light to separate the LED chips line by line from the second transfer substrate, urging the LED chips toward the circuit board, and by moving the second transfer substrate and the circuit board relative to each other at different speeds and in a direction perpendicular to the linear laser light, at least the transferring of the first surface side of the LED chips to the second transfer substrate and the transferring of the second surface side of the LED chips to the circuit board being executed in a vacuum environment.

With this configuration, the transferring of the first surface side of the LED chips to the second transfer substrate and the transferring of the second surface side of the LED chips to the circuit board in a vacuum environment eliminates the influence of air resistance during transfer and allows the LED chips to be transferred very accurately, and also allows the LED chips to be transferred to and mounted on the circuit board at high speed and at an arbitrary pitch that is different from the pitch of the LED chips arranged on the carrier substrate.

The configuration may be such that the transferring of the second surface side of the LED chips to the circuit board is executed again such that new LED chips are disposed between the LED chips in a longitudinal direction of the linear laser light that have been already transferred to the circuit board in the previous transferring of the second surface side of the LED chips to the circuit board.

With this configuration, a plurality of types of LED chips can be mounted in a line shape, and the gap between the second transfer substrate and the circuit board can be reduced.

Also, to solve the above problem, the present invention provides a mounting method for mounting diced LED chips, a first surface of which is held on a carrier substrate, on a circuit board, the mounting method comprising: transferring the LED chips to a first-A transfer substrate by separating the LED chips from the carrier substrate such that a second surface of the LED chips on an opposite side from the first surface of the LED chips is held on the first-A transfer substrate; transferring a first surface side of the LED chips to a first-B transfer substrate by separating the LED chips from the first-A transfer substrate such that the first surface side of the LED chips is held on the first-B transfer substrate; disposing a second transfer substrate such that the second transfer substrate faces, across a gap, the second surface of the LED chips while the first surface of the LED chips is held on the first-B transfer substrate; transferring a second surface side of the LED chips to the second transfer substrate by irradiating the first-B transfer substrate with a linear laser light to separate the LED chips line by line from the first-B transfer substrate, by urging the LED chips toward the second transfer substrate, and by moving the first-B transfer substrate and the second transfer substrate relative to each other at different speeds and in a direction perpendicular to the linear laser light; disposing the second transfer substrate by rotating the second transfer substrate by 90° around a normal line of the second transfer substrate with respect to the linear laser light; disposing a third transfer substrate such that the third transfer substrate faces, across a gap, the first surface of the LED chips while the second surface of the LED chips is held on the second transfer substrate; transferring the first surface side of the LED chips to the third transfer substrate by irradiating the second transfer substrate with a linear laser light to separate the LED chips line by line from the second transfer substrate, by urging the LED chips toward the third transfer substrate, and by moving the second transfer substrate and the third transfer substrate relative to each other at different speeds and in a direction perpendicular to the linear laser light; performing thermocompression bonding between bumps on the second surface of the LED chips and electrodes of the circuit board after disposing bumps of the LED chips to face the electrodes of the circuit board while the first surface of the LED chips is held on the third transfer substrate; and removing the third transfer substrate by separating the first surface of the LED chips from the third transfer substrate, at least the transferring of the second surface side of the LED chips to the second transfer substrate and the transferring of the first surface side of the LED chips to the third transfer substrate being execute in a vacuum environment.

With this configuration, because the transferring of the second surface side of the LED chips to the second transfer substrate and the transferring of the first surface side of the LED chips to the third transfer substrate are performed in a vacuum environment, the LED chips can be transferred very accurately by eliminating the influence of air resistance during transfer. Also, the performing of the thermocompression bonding allows the LED chips to be securely bonded to the circuit board, and affords highly accurate mounting.

Also, to solve the above problem, the present invention provides a transfer device for transferring LED chips held on a transfer substrate to a transfer-target substrate, the transfer device comprising: an evacuation component configured to put an interior of the transfer device under a vacuum; a laser light emitter configured to irradiate the transfer substrate with a laser light; a transfer substrate holder configured to hold the transfer substrate, the transfer substrate holder being movable in a first direction; a transfer-target substrate holder configured to hold the transfer-target substrate such that the transfer-target substrate faces, across a gap, the LED chips that is held on the transfer substrate, the transfer-target substrate holder being movable in at least the first direction; and a controller configured to control the laser light emitter, the transfer substrate holder, and the transfer-target substrate holder such that the LED chips are transferred to the transfer-target substrate by separating the LED chips from the transfer substrate and by urging the LED chips toward the transfer-target substrate.

With this configuration, performing the transfer of the LED chips from the transfer substrate to the transfer-target substrate in a vacuum environment allows the LED chips to be transferred very accurately by eliminating the influence of air resistance during transfer.

Also, to solve the above problem, the present invention provides a mounting device for mounting LED chips on a circuit board, the mounting device comprising: an evacuation component configured to put an interior of the mounting device under a vacuum; a laser light emitter configured to irradiate a transfer substrate on which the LED chips are arranged with a linear laser light; a transfer substrate holder configured to hold the transfer substrate, the transfer substrate holder being movable in a first direction; a transfer-target substrate holder configured to hold a transfer-target substrate or the circuit board such that the transfer-target substrate or the circuit board faces, across a gap, the LED chips held on the transfer substrate, the transfer-target substrate holder being movable in at least the first direction; and a controller configured to control the laser light emitter, the transfer substrate holder, and the transfer-target substrate holder such that the LED chips are transferred to the transfer-target substrate or the circuit board by moving the transfer substrate and the transfer-target substrate or the circuit board relative to each other at different speeds in a direction perpendicular to the linear laser light, by separating a line of the LED chips that corresponds to the linear laser light, and by urging the line of the LED chips toward the transfer-target substrate or the circuit board.

With this configuration, performing the transfer of the LED chips from the transfer substrate to the transfer-target substrate in a vacuum environment allows the LED chips to be transferred very accurately to the circuit board by eliminating the influence of air resistance during transfer, and also allows the LED chips to be transferred to and mounted on the circuit board at high speed and at an arbitrary pitch that is different from the pitch of the LED chips arranged on the carrier substrate.

The configuration may be such that the mounting device further comprises a thermocompression bonding head configured to perform thermocompression bonding between the LED chips and the circuit board that is held on the transfer-target substrate holder, the transfer-target substrate holder having a heating mechanism that is configured to heat the circuit board or the transfer-target substrate that is held by the transfer-target substrate, and the controller being configured to control the thermocompression bonding such that the thermocompression bonding between the LED chips and the circuit board is performed by heating the thermocompression bonding head and the transfer-target substrate holder to the same temperature.

With this configuration, performing the thermocompression bonding allows the LED chips to be securely bonded to the circuit board, and affords highly accurate mounting.

With the transfer method, mounting method, transfer device, and mounting device of the present invention, it is possible to transfer and mount LED chips very accurately by eliminating the influence of air resistance during transfer.

DETAILED DESCRIPTION OF EMBODIMENTS

First Embodiment

Figure 1:
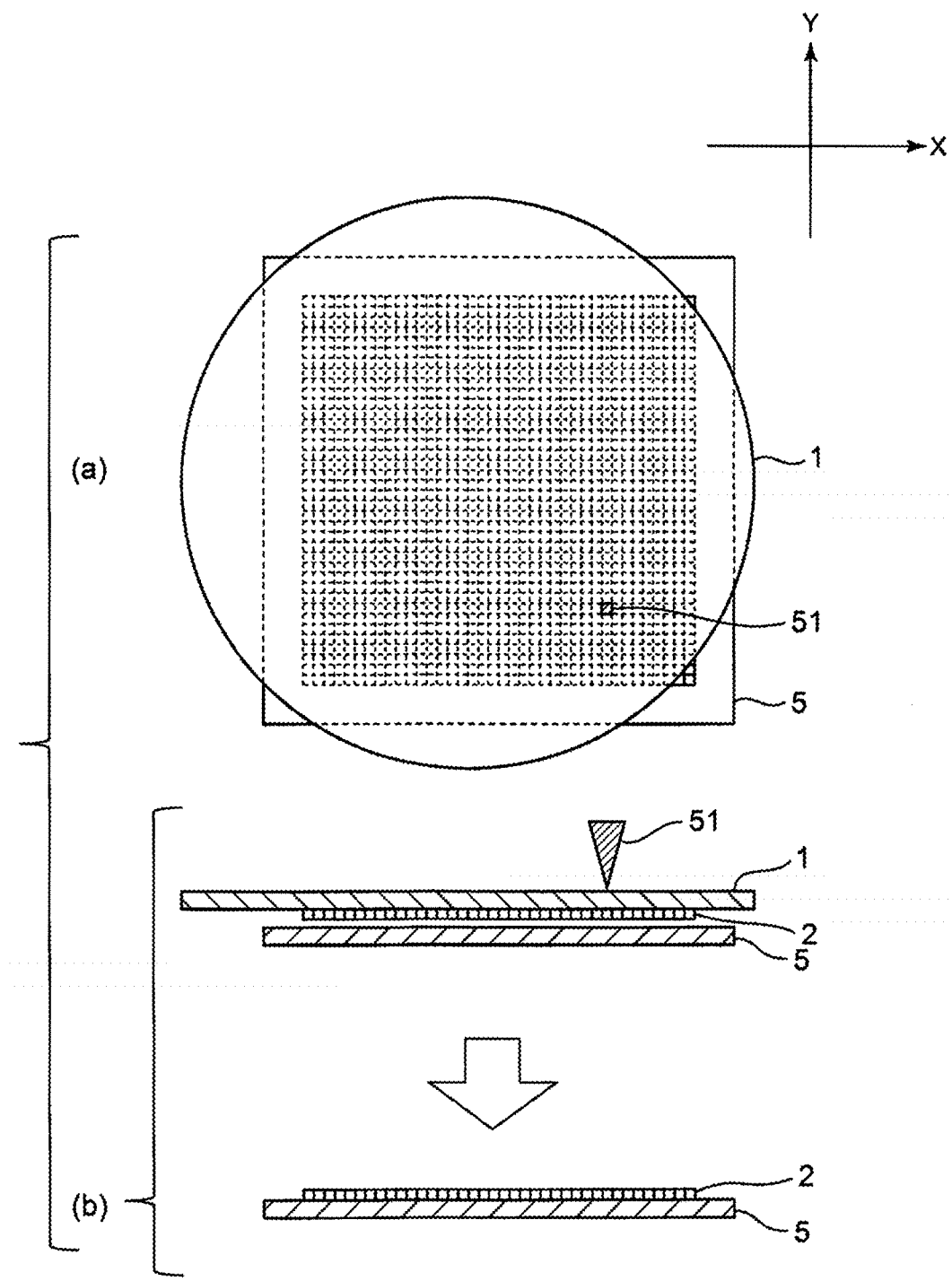
FIG. 1 is a diagram illustrating a transfer method in a first embodiment of the present invention.
Figure 2:
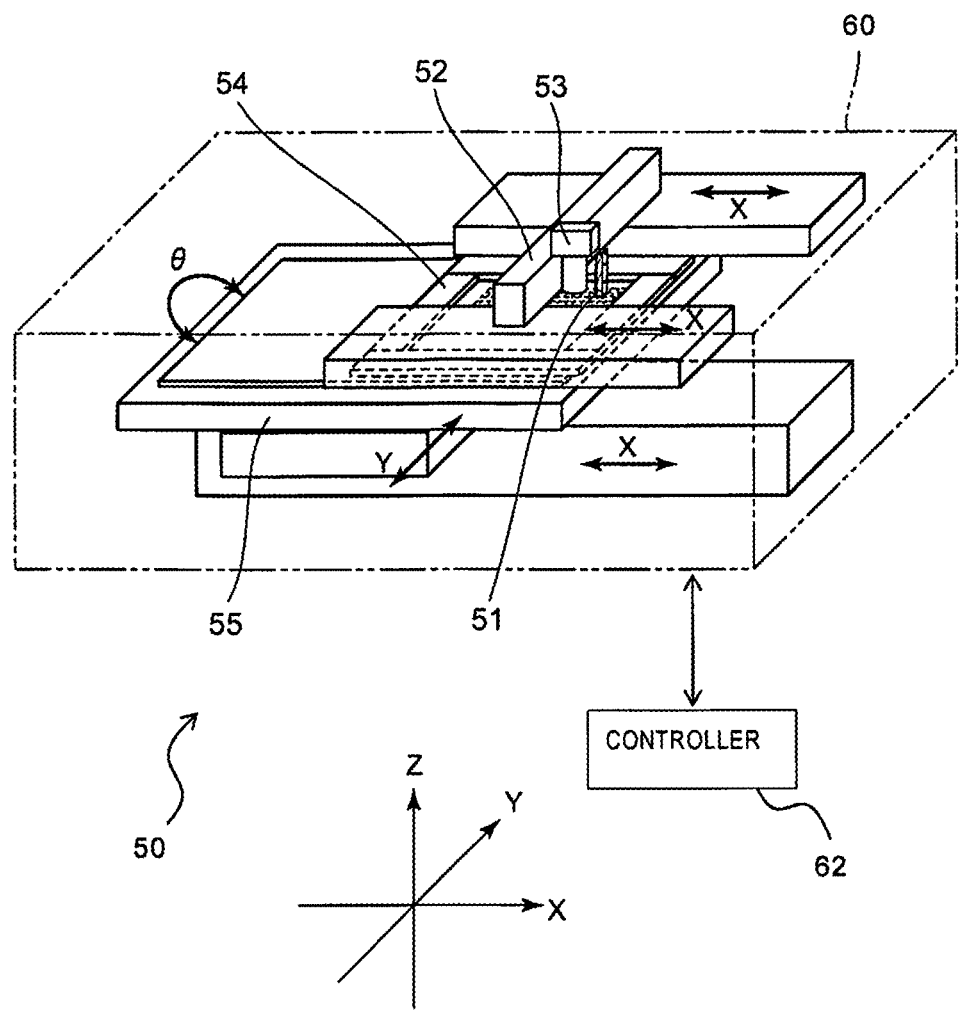
FIG. 2 is a diagram illustrating a transfer device in the first embodiment of the present invention.

A first embodiment of the present invention will be described with reference to FIGS. 1 and 2. FIG. 1 is a diagram illustrating a transfer method in the first embodiment of the present invention. FIG. 2 is a diagram illustrating a transfer device in the first embodiment of the present invention.

Transfer Method

As shown in part (a) of FIG. 1, the first surface side of the LED chips 2 is grown a from a carrier substrate 1 made of sapphire, and the second surface, which is the surface on the opposite side from the first surface, is exposed to the outside and has bumps formed on it. The carrier substrate 1 has a circular or quadrangular shape, and may be composed of gallium arsenide besides sapphire. The LED chips 2 are diced into a plurality of units (from several hundred to tens of thousands) and arranged two-dimensionally on the carrier substrate 1. Small LED chips 2, called a micro LEDs, measure 50×50 μm or less, and are arranged at a pitch obtained by adding the dicing width to this size. Such small LED chips 2 need to be mounted very accurately on a circuit board (for example, an accuracy of 1 μm or less). With the LED chips 2 in the first embodiment, each LED chip 2 is inspected beforehand, and any defective LED chips are removed. More specifically, a laser light stronger than that used in laser lift-off (discussed below) is emitted to burn out the defective chips.

With the transfer method in the first embodiment, the LED chips 2 are separated one by one from the carrier substrate 1, which is a transfer substrate, and the second surface side of the LED chips 2 is directly transferred to the circuit board 5, which is a transfer-target substrate. In other words, the carrier substrate 1, which is composed of sapphire, is irradiated with a spot-like laser light 51 consisting an of excimer laser, and one LED chip 2 is separated from the carrier substrate 1. Part of the GaN layer on the carrier substrate 1 on the first surface side of the LED chip 2 is broken down into gallium and nitrogen to separate the LED chip 2, and when nitrogen is generated in the course of this decomposition, the chip can be urged (nudged) toward the circuit board 5. This method is called laser lift-off, and the separated and urged LED chip 2 is transferred to the circuit board 5.

In the first embodiment, as shown in part (b) of FIG. 1, the LED chips 2 and the circuit board 5 are disposed opposite each other with a gap in between, and are irradiated with the laser light 51, but this gap is not necessarily required, and the configuration may instead be such that the laser light 51 is emitted in a state in which the LED chip 2 and the circuit board 5 are touching each other. Not providing this gap prevents the LED chips 2 from falling under the influence of air resistance, which would lead to positional deviation. Also, this first transfer step may be carried out in a vacuum. If the step is conducted in a vacuum, then even if the above-mentioned gap is provided, the LED chips 2 will not be subjected to air resistance when being urged, thus preventing positional deviation.

A transfer layer (not shown) is provided in advance on the surface of the circuit board 5, and the transferred LED chips 2 are held by this transfer layer, and as shown in part (b) of FIG. 1, the LED chips 2 are held by the circuit board 5. The transfer layer referred to here is one that has adhesiveness at normal temperature, is solidified by heat or ultraviolet light, and decomposes and generates gas upon irradiation with laser light. That is, after an LED chip 2 is urged toward the transfer layer of the adhesive circuit board 5 and has landed there, the transfer layer of the circuit board 5 is solidified by the heat of the LED chip 2, and the LED chip 2 is held in place. If the heat of the LED chip 2 is too low, the transfer layer may be heated after the LED chip 2 has landed. At this point, a bump on the second surface of the LED chip 2 is in contact with the electrodes of the circuit board 5. Furthermore, the LED chip 2 may be pressed and heated so that the bump of the LED chip 2 and the electrodes of the circuit board 5 are securely joined together.

Thus, in the transfer method in the first embodiment, the LED chips 2 held on the transfer substrate can be transferred one by one to the transfer-target substrate. Therefore, this method is particularly effective when repairing, etc.

In the first embodiment, transfer from the carrier substrate to the circuit board was given as an example, but this is not the only option, and the present invention can also be applied to the transfer of LED chips from a carrier substrate to a transfer substrate (discussed below), from a transfer substrate to a transfer substrate, or from a transfer substrate to a circuit board. It is also possible for all of a plurality of LED chips arranged in one line to be transferred all at once, as in a second embodiment (discussed below), by using a linear laser light.

Transfer Device

Next, a transfer device in the first embodiment of the present invention will be described with reference to FIG. 2. FIG. 2 is a diagram illustrating a transfer device in the first embodiment of the present invention.

The transfer device 50 is equipped with an evacuation component 60, and the entire transfer device 50 can be made into a vacuum chamber to create a vacuum environment. For example, the evacuation component 60 can include a vacuum pump and a vacuum chamber that houses the transfer device 50 in the vacuum environment. The transfer device 50 comprises a transfer substrate holder 54 that holds the transfer substrate and is movable in the X direction, a transfer-target substrate holder 55 that holds a transfer-target substrate so as to face, across a gap, the transfer substrate on the lower side of the transfer substrate holder 54, and is movable in the X direction, the Y direction, the Z direction, and the θ direction, a laser light emitter 52 that irradiates the transfer substrate with a laser light 51, and an electric controller 62 that controls the laser light emitter 52, the transfer substrate holder 54, and the transfer-target substrate holder 55 so as to separate the LED chips 2 from the transfer substrate and urge the LED chips 2 to be transferred to the transfer-target substrate.

The laser light emitter 52 is fixed to the transfer device 50. In the first embodiment, the spot-like laser light 51 is emitted so as to irradiate one LED chip 2. Also, a camera 53 is provided at a position near the laser light emitter 52. The camera 53 recognizes the position of the transfer substrate or the transfer-target substrate, and moves the transfer-target substrate holder 55 in the X, Y, or θ direction to perform alignment. In the illustrated embodiment, the controller 62 can be a computer that includes at least one processor having a CPU (Central Processing Unit), a computer memory having a ROM (Read Only Memory), a RAM (Random Access Memory), and/or a storage device, and the like. The storage device is, for example, a hard disk drive, a semiconductor storage device and the like. The controller 62 is electrically connected to various components of the transfer device 50 to control the transfer device 50. For example, the controller 62 is electrically connected to a driver and/or an actuator of the laser light emitter 52, the camera 53, the transfer substrate holder 54, the transfer-target substrate holder 55, and the evacuation component 60 to operate the laser light emitter 52, the camera 53, the transfer substrate holder 54, the transfer-target substrate holder 55, and the evacuation component 60 in a manner described in the present disclosure (i.e., a transfer method of the present disclosure).

In the first embodiment, "transfer substrate" refers to the carrier substrate 1, and "transfer-target substrate" refers to the circuit board 5. In other words, the carrier substrate 1 is held by the transfer substrate holder 54, and the circuit board 5 is held by the transfer-target substrate holder 55.

If transfer is performed without leaving a gap between the LED chips 2 held on the transfer substrate and the transfer-target substrate, then the transfer-target substrate holder 55 is moved in the Z direction to bring the LED chips 2 on the carrier substrate 1 held by the transfer substrate holder 54 into contact with the circuit board 5 held by the transfer-target substrate holder 55.

If transfer is performed with a gap between the LED chips 2 held on the carrier substrate 1 and the circuit board 5, alignment is possible by having the transfer substrate holder 54 holding the carrier substrate 1 move in the X direction, or the transfer-target substrate holder 55 holding the circuit board 5 move in the X direction, the Y direction, and/or the θ direction, and the laser light emitter 52 emits the spot-shaped laser light 51 at the desired location so that the LED chips 2 are separated, urged toward the circuit board 5 held by the transfer-target substrate holder 55, and transferred. In this case, positional deviation can be prevented, without the urged LED chips 2 being influenced by air resistance, by putting the inside of the transfer device 50 under a vacuum with the evacuation component 60.

In the first embodiment, the transfer-target substrate holder 55 is configured to be movable in the X direction, the Y direction, the Z direction, and the θ direction, but the present invention is not necessarily limited to this, and suitable modifications are possible as needed. For example, if rotational alignment is unnecessary, movement in the θ direction is unnecessary, and if there is no need to change the spacing between the transfer substrate and the transfer-target substrate, movement in the Z direction is unnecessary. Also, the transfer substrate holder 54 may be movable in the Y direction.

Thus, the first embodiment is a transfer method for transferring LED chips, one surface of which is held on a transfer substrate, to a transfer-target substrate, the method comprising:

a transfer-target substrate disposition step of disposing the transfer-target substrate so as to face, across a gap, the surface of the LED chips on the opposite side from the one surface of the LED chips; and a transfer step of irradiating the transfer substrate with a laser light to separate the LED chips from the transfer substrate, and urging the LED chips toward the transfer-target substrate to transfer the LED chips to the transfer-target substrate, wherein at least the transfer step is carried out in a vacuum, which makes it possible to transfer the LED chips very accurately by eliminating the influence of air resistance during transfer.

Also, with a transfer device for transferring LED chips held on a transfer substrate to a transfer-target substrate, the device comprising:

an evacuation component that puts the interior of the transfer device under a vacuum;

a laser light emitter that irradiates the transfer substrate with a laser light;

a transfer substrate holder that holds the transfer substrate and is movable in a first direction;

a transfer-target substrate holder that holds the transfer-target substrate so as to face, across a gap, the LED chips held on the transfer substrate, and is movable in at least the first direction; and a controller that controls the laser light emitter, the transfer substrate holder, and the transfer-target substrate holder so that the LED chips are separated from the transfer substrate and are urged toward and transferred to the transfer-target substrate, the LED chips can be transferred very accurately by eliminating the influence of air resistance during transfer.

Second Embodiment

Figure 3:
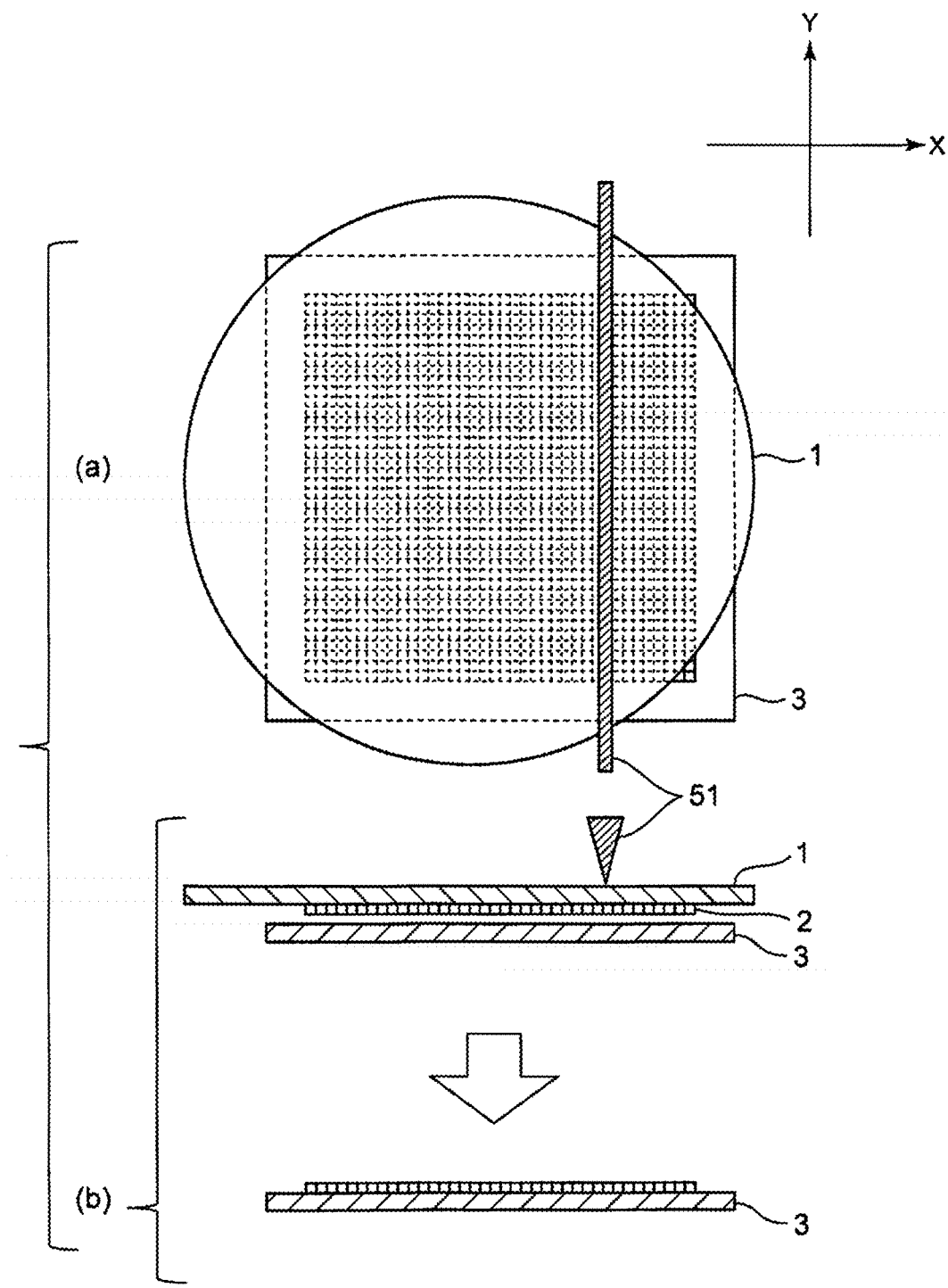
FIG. 3 is a diagram illustrating a first transfer step of a mounting method in a second embodiment of the present invention.
Figure 4:
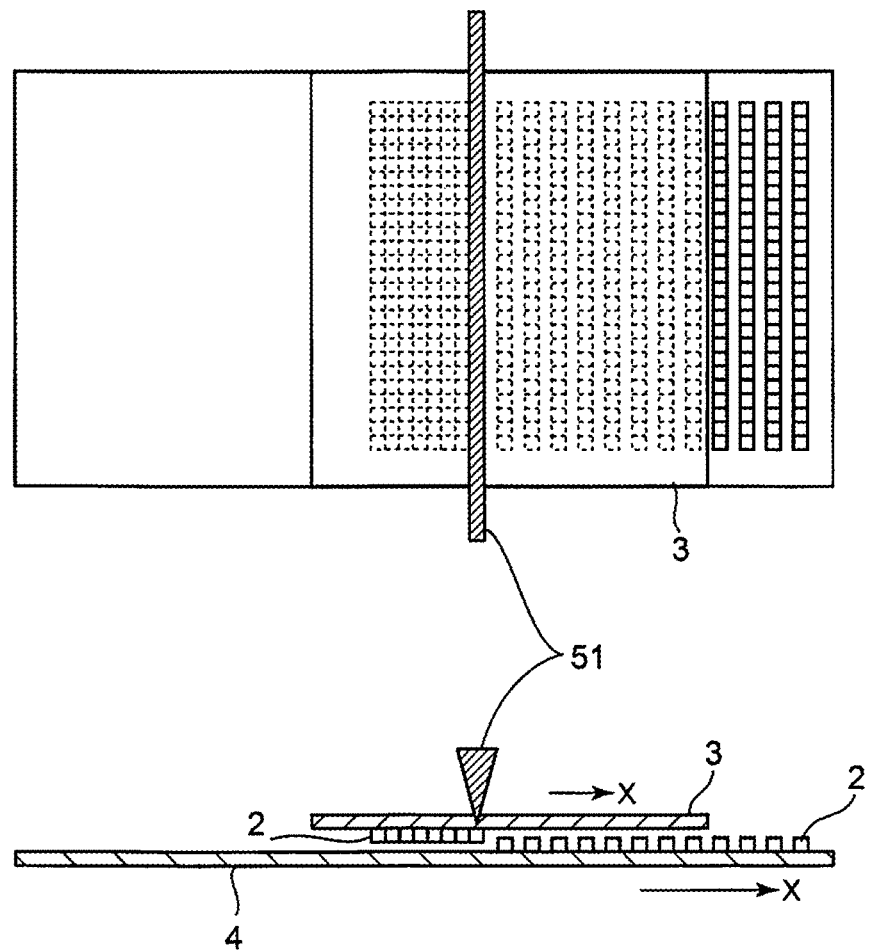
FIG. 4 is a diagram illustrating a second transfer step of the mounting method in the second embodiment of the present invention.
Figure 5:
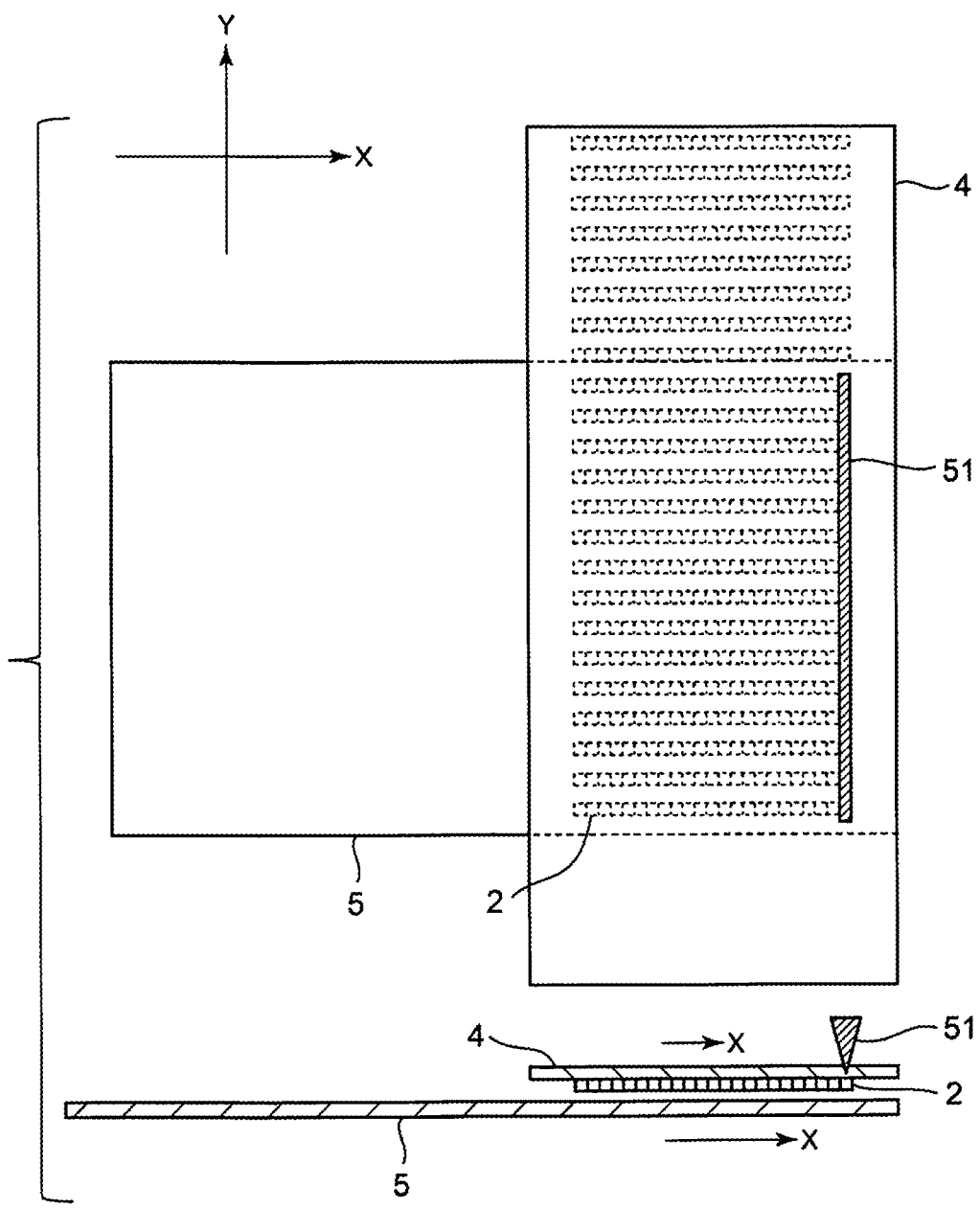
FIG. 5 is a diagram illustrating the beginning of a first mounting step of the mounting method in the second embodiment of the present invention.
Figure 6:
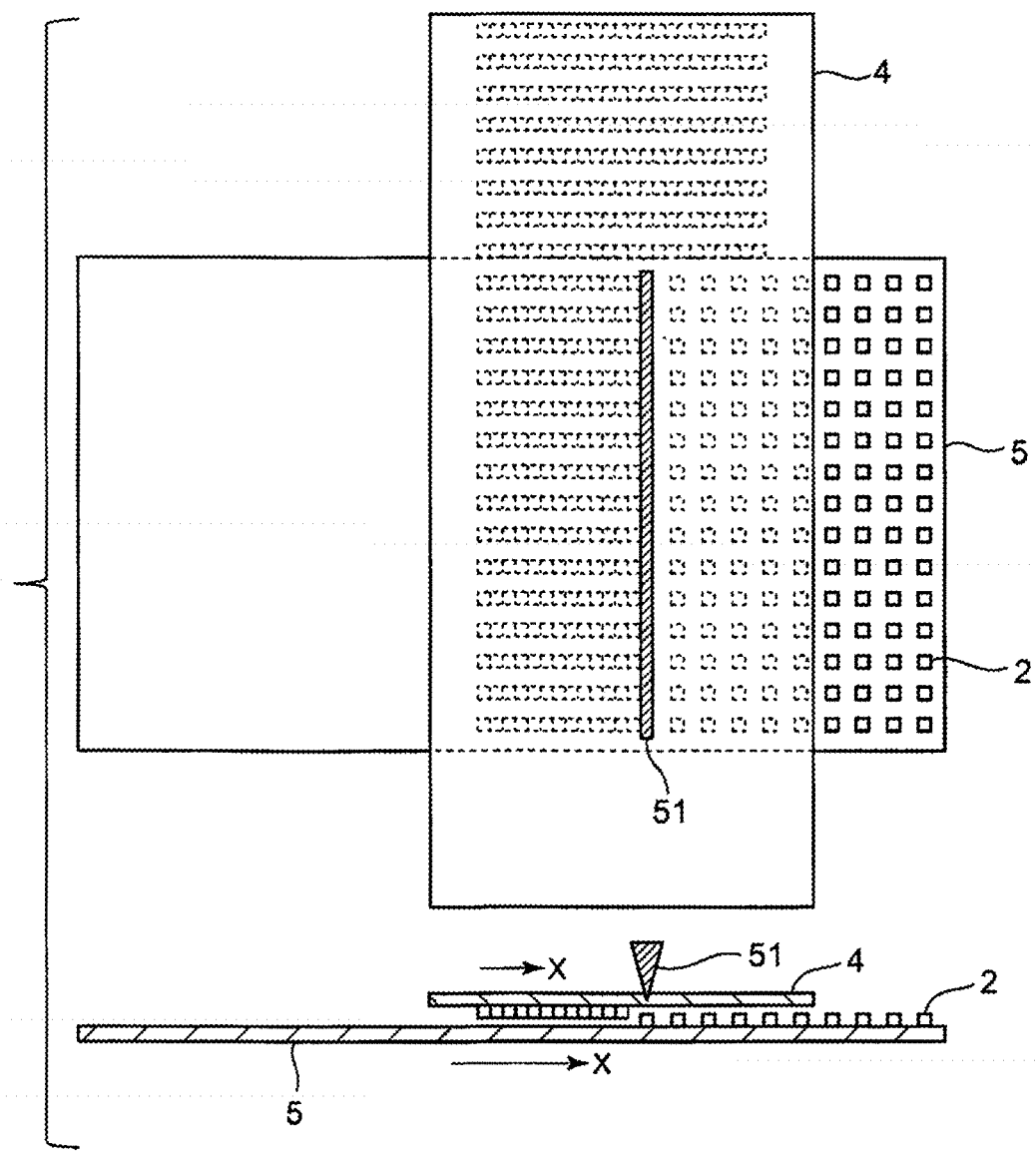
FIG. 6 is a diagram illustrating the middle of the first mounting step of the mounting method in the second embodiment of the present invention.
Figure 7:
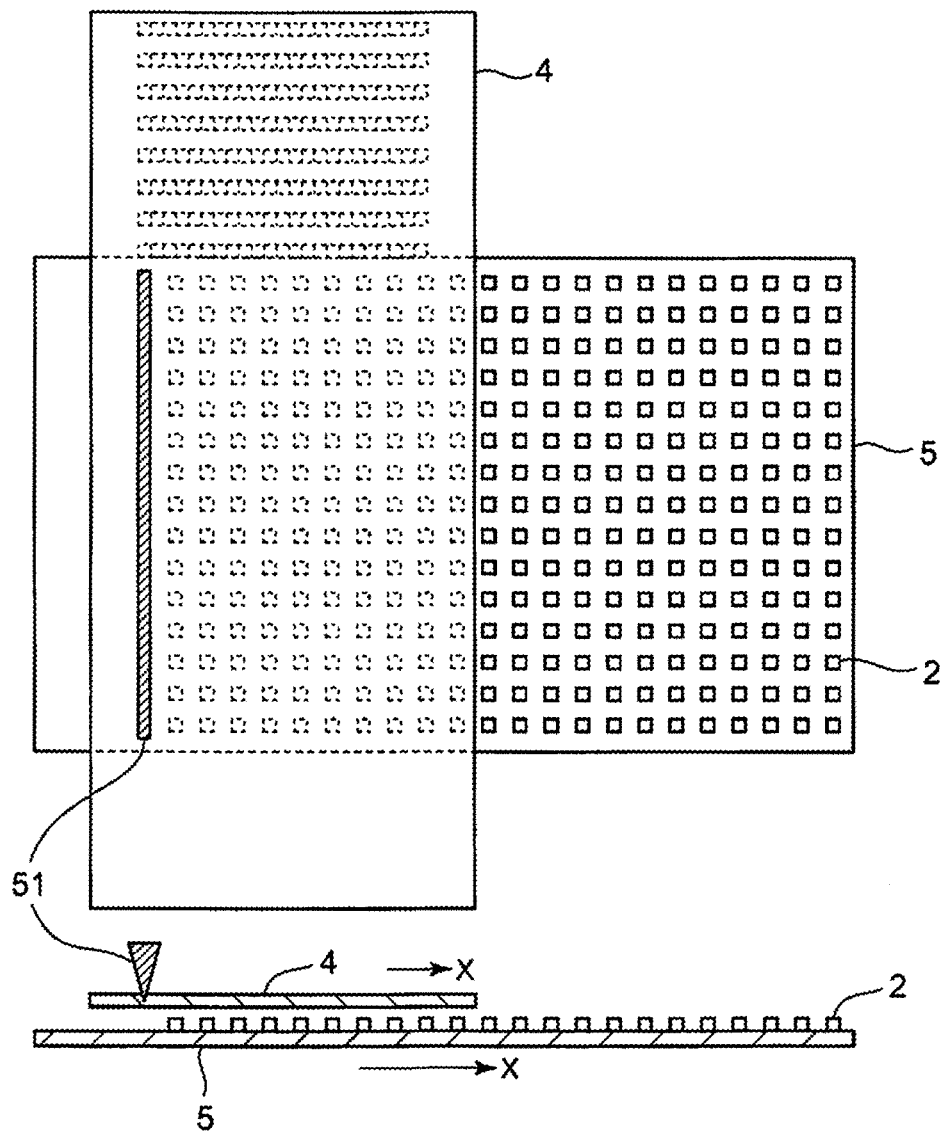
FIG. 7 is a diagram illustrating the end of the first mounting step of the mounting method in the second embodiment of the present invention.
Figure 8:
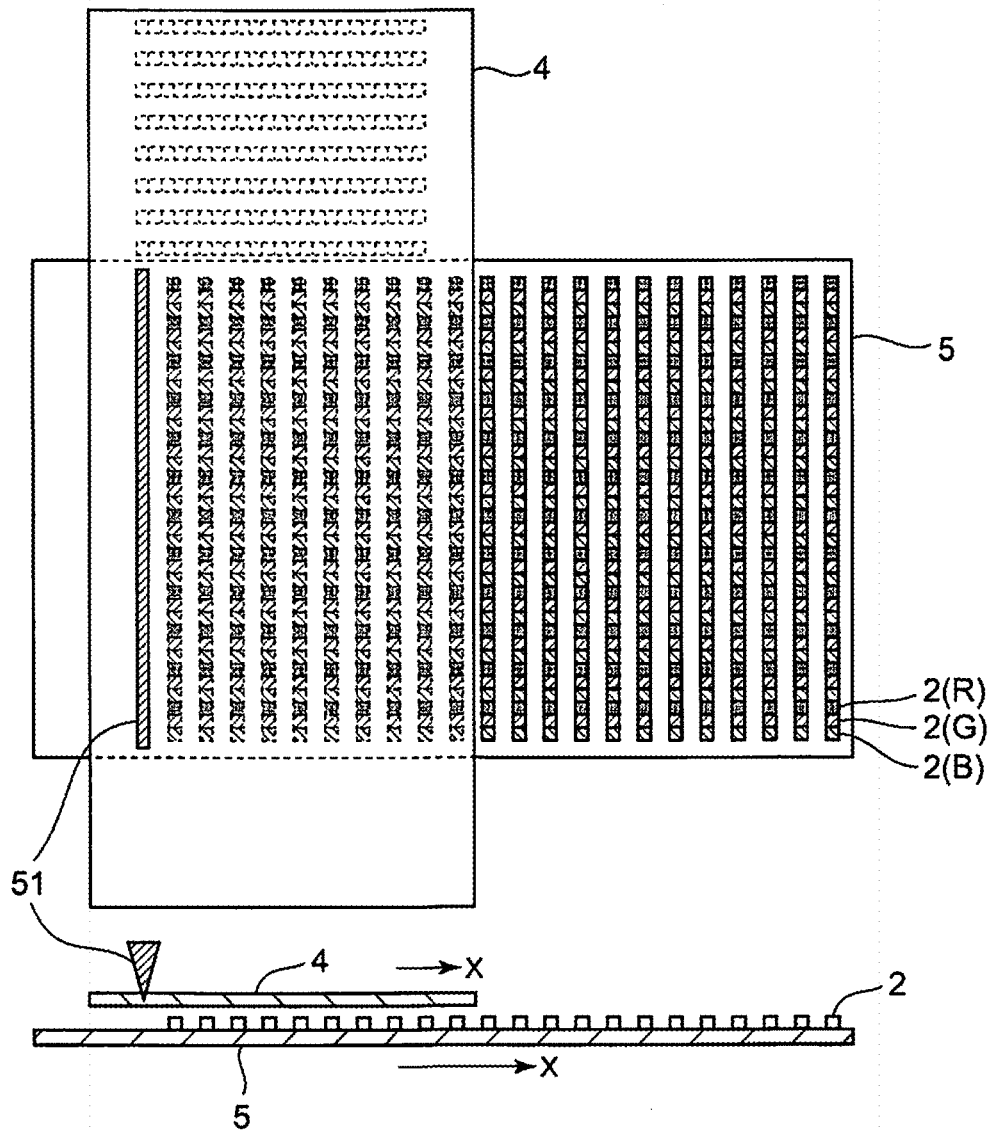
FIG. 8 is a diagram illustrating the mounting of three colors of RGB by the mounting method in the second embodiment of the present invention.
Figure 9:
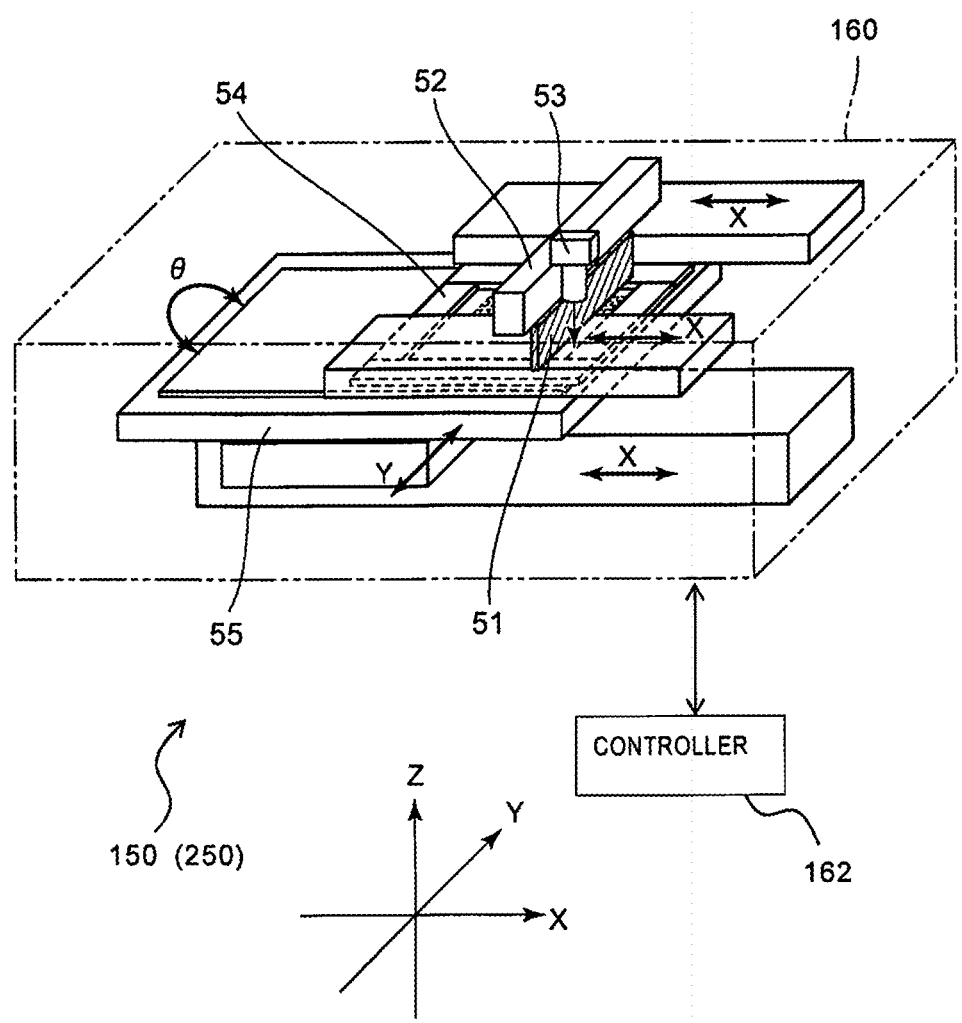
FIG. 9 is a diagram illustrating a mounting device in the second embodiment of the present invention.

A second embodiment differs from the first embodiment in that the LED chips 2 held on the carrier substrate are mounted at high speed to a circuit board. The mounting method according to the second embodiment of the present invention will be described with reference to FIGS. 3 to 9. FIG. 3 is a diagram illustrating a first transfer step of the mounting method in the second embodiment of the present invention. FIG. 4 is a diagram illustrating a second transfer step of the mounting method in the second embodiment of the present invention. FIG. 5 is a diagram illustrating the beginning of a first mounting step of the mounting method in the second embodiment of the present invention. FIG. 6 is a diagram illustrating the middle of the first mounting step of the mounting method in the second embodiment of the present invention. FIG. 7 is a diagram illustrating the end of the first mounting step of the mounting method in the second embodiment of the present invention. FIG. 8 is a diagram illustrating the mounting of three colors of RGB by the mounting method in the second embodiment of the present invention. FIG. 9 is a diagram illustrating a mounting device in the second embodiment of the present invention.

Mounting Method

First, the first transfer step is performed to separate LED chips 2 from the carrier substrate 1, and the second surface side of the LED chips 2 is transferred to and held on the first transfer substrate 3. In the second embodiment, as shown in part (a) of FIG. 3, the carrier substrate 1 is irradiated with a laser light 51 consisting of a linear excimer laser, and either the carrier substrate 1 or the linear laser light 51 is moved relatively in the X direction so that the entire carrier substrate 1 is irradiated with the laser light. Then, a part of the GaN layer in the carrier substrate 1, which is composed of sapphire, is broken down into gallium and nitrogen, and the LED chips 2 are separated and urged toward the first transfer substrate 3. This method is called laser lift-off, in which the separated LED chips 2 are urged by the generation of nitrogen when the GaN decomposes, and are transferred to the first transfer substrate 3.

In the illustrated embodiment, as shown in part (b) of FIG. 3, a gap is provided between the LED chips 2 and the first transfer substrate 3 when the laser light 51 is emitted, but this gap is not necessarily required, and the configuration may be such that the laser light 51 is emitted in a state in which the LED chips 2 and the first transfer substrate 3 are touching each other. Not providing this gap prevents the LED chips 2 from being urged under the influence of air resistance, which would lead to positional deviation. Also, this first transfer step may be carried out in a vacuum. If the step is conducted in a vacuum, then even if the above-mentioned gap is provided, the LED chips 2 will not be subjected to air resistance when being urged, thus preventing positional deviation.

A transfer layer (not shown) is provided in advance on the surface of the first transfer substrate 3, the transferred LED chips 2 are held by this transfer layer, and as shown in part (b) of FIG. 3, the LED chips 2 are held on the first transfer substrate 3. Here, the "transfer layer" is one that has adhesiveness at normal temperature, is solidified by heat or ultraviolet light, and decomposes and generates gas upon irradiation with laser light. That is, after the LED chips 2 are urged toward the transfer layer of the first transfer substrate 3 having adhesiveness and have landed there, the transfer layer of the first transfer substrate 3 is solidified by the heat of the LED chips 2, and the LED chips 2 are held in place. If the heat of the LED chips 2 is too low, the transfer layer may be heated after the LED chips 2 have landed. At this point, bumps on the second surface of the LED chips 2 are in contact with the first transfer substrate 3.

Next, a second transfer substrate disposition step is performed. That is, a second transfer substrate 4 is disposed so as to face, across a gap, the first surface of the LED chips 2, the second surface of which is held on the first transfer substrate 3. At this point, in the second embodiment, the first transfer substrate 3 is disposed on the upper side with the held LED chips 2 facing downward, and the second transfer substrate 4 is disposed on the lower side of the first transfer substrate 3 (see FIG. 4). The second transfer substrate disposition step may be performed in a vacuum, although this is not necessarily required.

Subsequently, the second transfer step is performed in a vacuum. That is, the first transfer substrate 3 is moved in the X direction at a first speed, and the second transfer substrate 4 is moved in the X direction at a second speed that is faster than the first speed. The moving first transfer substrate 3 is irradiated with a linear laser light 51 along the Y direction to reduce the adhesion of the transfer layer, so that the plurality of LED chips 2 in one line are separated in the Y direction from the first transfer substrate 3. Here, just as in the first transfer step, the separated LED chips 2 are urged toward the second transfer substrate 4, and the first surface side of the LED chips 2 is transferred.

As shown in FIG. 4, while the first transfer substrate 3 is moved in the X direction at the first speed, and the second transfer substrate 4 is moved in the X direction at the second speed, which is faster than the first speed, the linear laser light 51 is emitted along the Y direction of the first transfer substrate to separate the plurality of LED chips 2 in one line and urge them toward the second transfer substrate 4, which allows the LED chips 2 arranged in the X direction at a first pitch and in the Y direction at a second pitch on the first transfer substrate 3 to be arranged on and transferred to the second transfer substrate 4 in the X direction at a third pitch wider than the first pitch, and in the Y direction at the second pitch. This third pitch can be the pitch of the LED chips on the circuit board constituting a display. The first surface side of the transferred LED chips 2 is transferred to the second transfer substrate 4, so that the bumps of the LED chips 2 face the outside.

Performing the second transfer step in a vacuum prevents the LED chips 2 that are separated and urged from the first transfer substrate 3 from being transferred to the wrong position on the second transfer substrate 4 due to air resistance. Furthermore, in order to prevent positional deviation, it is preferable for the gap between the first transfer substrate 3 and the second transfer substrate 4 to be as narrow as possible, and in the second embodiment, the distance is set by adding a slight clearance to the height of the LED chips 2.

A transfer layer (not shown) is provided to the surface of the second transfer substrate 4. The LED chips 2 separated from the first transfer substrate 3 are urged toward and adhesively held on the transfer layer provided to the surface of the second transfer substrate 4. Here, as described above, the transfer layer is one that is adhesive at normal temperature, is solidified by heat or ultraviolet light, and decomposes and generates gas upon being irradiated with a laser light. That is, the transfer layer of the first transfer substrate 3 is decomposed by the laser light and generates gas, which generates an urging force, so the LED chips 2 are urged toward and land on the transfer layer of the adhesive second transfer substrate 4, after which the transfer layer of the second transfer substrate 4 is solidified by the heat of the LED chips 2 and held in place. If the heat of the LED chips 2 is too low, the transfer layer may be heated after the LED chips 2 have landed.

In the second embodiment, the configuration is such that the first transfer substrate 3 and the second transfer substrate 4 are both moved in the X direction during transfer of the LED chips 2, but this is not necessarily the only option, and the configuration can be changed as needed according to the device in question. For instance, the configuration may be such that the linear laser light 51 is emitted along the X direction, and the first transfer substrate 3 and the second transfer substrate 4 are moved in the Y direction. Also, the configuration may be such that the linear laser light 51 is emitted along the Y direction, the first transfer substrate 3 is moved in the X direction, and the second transfer substrate 4 is moved in the −X direction, so that the two move in opposite directions. That is, the configuration may be such that the first transfer substrate 3 and the second transfer substrate 4 move at different speeds and relative to each other in a direction perpendicular to the linear laser light 51.

Consequently, the LED chips 2 held on the first transfer substrate 3 can be transferred to the second transfer substrate 4 at different pitches. Also, adjusting the first speed and the second speed allows the LED chips 2 to be transferred to the second transfer substrate 4 at the desired pitch.

In the second embodiment, the first transfer substrate 3 is disposed on the upper side and the second transfer substrate 4 is arranged on the lower side, but this is not necessarily the only option, and the configuration can be changed as needed to suit the layout. For instance, the first transfer substrate 3 may be disposed on the lower side as it is in the first transfer step, the second transfer substrate 4 disposed on the upper side, and the LED chips 2 urged toward and transferred to the second transfer substrate 4 on the upper side, from the first transfer substrate 3 on the lower side. In addition, the second transfer step may be performed in a state in which the first transfer substrate 3 and the second transfer substrate 4 are facing each other with a gap in between, and stood up in the Z direction.

Next, a second transfer substrate rotation step is carried out in which the second transfer substrate 4 is rotated by 90° around its normal line and is disposed on the upper side with the LED chip holding side facing downward. Here, saying that the second transfer substrate 4 is rotated by 90° around its normal line means rotating the orientation of the second transfer substrate 4 by 90° with respect to the longitudinal direction of the linear laser light. The second transfer substrate rotation step may be carried out in a vacuum, or not in a vacuum. Performing the second transfer substrate rotation step causes the second transfer substrate 4, which has been horizontally disposed in the X direction, to be rotated by 90° into a vertical disposition as shown in FIG. 5.

After this, the circuit board disposition step is performed. That is, the circuit board 5 is disposed so as to face, across a gap, the second surface of the LED chips 2, the first surface of which is held on the second transfer substrate 4. In the second embodiment, the second transfer substrate is disposed on the upper side and the circuit board 5 on the lower side so that the held LED chips 2 face downward (see FIG. 5). This circuit board disposition step may be carried out in a vacuum, but it is not always necessary to be in a vacuum.

Next, the first mounting step is performed in a vacuum. That is, the second transfer substrate 4 is moved in the X direction at a third speed, and the circuit board 5 is moved in the X direction at a fourth speed that is faster than the third speed. The moving second transfer substrate 4 is irradiated with the linear laser light 51 along the Y direction to decompose the transfer layer and separate the plurality of LED chips 2 in one line in the Y direction from the second transfer substrate 4, and to urge them toward the circuit board 5. The second surface side of the LED chips 2 is then transferred to the circuit board 5. The circuit board 5 has electrodes, and these electrodes are joined to the bumps on the second surface of the LED chips 2.

As shown in FIG. 5, while the second transfer substrate 4 is being moved at the third speed in the X direction and the circuit board 5 is being moved at the fourth speed, which is faster than the third speed, in the X direction, the linear laser light 51 is emitted in the Y direction of the second transfer substrate 4 to separate and urge the plurality of LED chips 2 in one line, which allows the LED chips 2 arranged in the X direction at the second pitch and the Y direction at the third pitch on the second transfer substrate 4, which has been rotated 90° in the second transfer substrate rotation step, to be transferred to the circuit board 5 while arranged in the X direction at the fourth pitch, which is wider than the second pitch, and in the Y direction at the third pitch. The third pitch and fourth pitch here can be considered to be the pitch of the LED chips on the circuit board constituting a display.

FIGS. 5 to 7 show how the LED chips 2 are transferred one line at a time while the second transfer substrate 4 and the circuit board 5 each move in the X direction. FIG. 5 shows the state at the beginning of the first mounting step, FIG. 6 shows the state in the middle of the first mounting step, and FIG. 7 shows the state at the end of the first mounting step.

In the second embodiment, the configuration is such that the second transfer substrate 4 and the circuit board 5 are moved in the X direction during the transfer of the LED chips 2, but this is not necessarily the only option, and changes may be made as needed according to the device. For instance, the configuration may be such that the linear laser light 51 is emitted along the X direction and the second transfer substrate 4 and the circuit board 5 are moved in the Y direction. Also, the configuration may be such that the linear laser light 51 is emitted along the Y direction, and the second transfer substrate 4 is moved in the X direction and the circuit board 4 is moved in the −X direction, that is, in opposite directions. Specifically, the configuration may be such that the second transfer substrate 4 and the circuit board 5 are moved at different speeds and relative to each other in a direction perpendicular to the linear laser light 51.

In the second embodiment, the configuration is such that the second transfer substrate rotation step is performed, and the first mounting step is performed by disposing the second transfer substrate 4 vertically and disposing the circuit board 5 horizontally as shown in FIG. 5, but this is not necessarily the only option, and changes can be made as needed according to the device, etc. For instance, instead of performing the second transfer substrate rotation step, the horizontal disposition of the second transfer substrate 4 may be left that way, while the longitudinal direction of the linear laser light is rotated 90° and the circuit board 5 is put in a horizontal disposition to perform the circuit board disposition step and the first mounting step. That is, the orientation of the second transfer substrate 4 may be rotated by 90° with respect to the longitudinal direction of the linear laser light.

Furthermore, in the second embodiment, the second transfer substrate is disposed on the upper side and the circuit board 5 on the lower side so that the held LED chips 2 face downward, but this is not necessarily the only option, and changes can be made as needed. For instance, the second transfer substrate may be left disposed on the lower side as it is in the second transfer step, the circuit board 5 may be disposed on the upper side, and the LED chips 2 may be transferred by being urged from the second transfer substrate 4 on the lower side toward the circuit board 5 on the upper side. In addition, the first mounting step may be performed in a state in which the second transfer substrate 4 and the circuit board 5 are facing each other with a gap in between, and stood up in the Z direction.

The first mounting step is performed in a vacuum as mentioned above. Performing the first mounting step in a vacuum prevents the LED chips 2 that have been separated from the second transfer substrate 4 and urged, from being transferred to wrong position on the circuit board 5 due to air resistance. In order to better prevent positional deviation, it is preferable for the gap between the second transfer substrate 4 and the circuit board 5 to be as narrow as possible, and in the second embodiment, the distance is set by adding a slight clearance to the height of the LED chips 2.

A transfer layer (not shown) is provided to the surface of the circuit board 5. The LED chips 2 separated from the second transfer substrate 4 are transferred to the transfer layer provided on the surface of the circuit board 5 by the urging force. Here, as described above, the transfer layer is one that is adhesive at normal temperature, is solidified by heat or ultraviolet light, and decomposes and generates gas upon being irradiated with a laser light. That is, the transfer layer of the second transfer substrate 4 is decomposed by the laser light and generates gas, which generates an urging force, so the LED chips 2 are urged toward and land on the transfer layer of the adhesive circuit board 5, after which the transfer layer of the circuit board 5 is solidified by the heat of the LED chips 2 and held in place. If the heat of the LED chips 2 is too low, the transfer layer may be heated after the LED chips 2 have landed.

By performing the first mounting step, as described above, the LED chips 2 are arranged on the circuit board 5 in the X direction at the fourth pitch wider than the second pitch, and in the Y direction at the third pitch wider than the first pitch. A second type of LED chips 2 can be arranged in a line in the Y direction by shifting the circuit board 5 or the second transfer substrate 4 by an amount corresponding to the first pitch in the Y direction, that is, by at least the length of the LED chips 2 in the Y direction, and performing the first mounting step again. That is, a second type of LED chips 2 can be arranged in a line in the Y direction by performing the first mounting step again so that new LED chips are disposed between the LED chips in the longitudinal direction of the linear laser light that have already been transferred to the circuit board 5 in the first mounting step. Furthermore, a third type of LED chips 2 can be arranged in a line in the Y direction by similarly performing the first mounting step a third time.

Here, if the first speed and the second speed are set in the second transfer step so that the third pitch is three times the first pitch, three types of LED chips 2 can be arranged, allowing them to be arranged with substantially no gap in the Y direction. If the first type of LED chips 2 are red LED chips 2 (R), the second type of LED chips 2 are green LED chips 2 (G), and the third type of LED chips 2 are blue LED chips 2 (B), then red, green, and blue LED chips 2 can be arranged without any gap in between them (see FIG. 8).

Here, by performing the first mounting step a second time by shifting the second transfer substrate 4 or the circuit board 5 by the first pitch in the Y direction, a second type of LED chips 2 can be transferred to the circuit board 5 such that the LED chips 2 held on the second transfer substrate 4 pass by the side of, rather than over, the LED chips 2 already transferred to the circuit board 5. Therefore, the gap between the second transfer substrate 4 and the circuit board 5 can be set to a gap obtained by adding a slight clearance to the height of the LED chips 2, which minimizes the distance that the LED chips 2 are urged, prevents positional deviation, and allows for stable and very accurate transfer.

After this, the LED chips 2 held on the circuit board 5 may be pressed and heated with a head or the like, and mounted so that the bumps of the LED chips 2 and the electrodes of the circuit board 5 are securely joined. In the second embodiment, the transfer layer is provided on the surface of the circuit board 5, but this is not necessarily the only option, and changes can be made as needed. For instance, a transfer layer may not be provided on the surface of the circuit board 5, and in the first mounting step the bumps provided on the second surface of the LED chips 2 may be directly joined to the electrodes of the circuit board 5.

Dropout or misalignment of the LED chips 2 may occur when transferring to the circuit board 5 due to failure in transfer or the like. If this happens, repair may be performed. Repair involves performing the mounting step in a vacuum, in which, after the circuit board 5 is disposed so that the first surface of the LED chips 2 faces, across a gap, the second surface, which is the surface on the opposite side from the first surface, the carrier substrate 1 is irradiated with a laser light to separate the LED chips 2 one at a time from the carrier substrate 1, the LED chips 2 are urged onto the circuit board 5, and the LED chips 2 are thereby transferred to the circuit board 5. Of course, if there are any misaligned LED chips 2 on the circuit board 5, they are removed beforehand with a head or the like.

Mounting Device

Next, the mounting device in the second embodiment of the present invention will be described with reference to FIG. 9. FIG. 9 is a diagram illustrating the mounting device the second embodiment of the present invention. A mounting device 150 differs from the mounting device 50 in the first embodiment in that the laser light emitter 52 emits a linear laser light 51, and a head (not shown) is provided which is capable of pressing and heating the LED chips transferred to the circuit board 5.

The mounting device 150 is provided with an evacuation component 160, and the entire mounting device 150 can be made into a vacuum chamber to create a vacuum environment. For example, the evacuation component 160 can include a vacuum pump and a vacuum chamber that houses the mounting device 150 in the vacuum environment. The mounting device 150 comprises a transfer substrate holder 54 that holds the transfer substrate and is movable in the X direction, a transfer-target substrate holder 55 that holds a transfer-target substrate so as to face, across a gap, the transfer substrate on the lower side of the transfer substrate holder 54, and is movable in the X direction, the Y direction, the Z direction, and the θ direction, a laser light emitter 52 that irradiates the transfer substrate with a laser light 51, and an electric controller 162 that controls the laser light emitter 52, the transfer substrate holder 54, and the transfer-target substrate holder 55 so as to separate the LED chips 2 from the transfer substrate and urge the LED chips 2 to be transferred to the transfer-target substrate. In addition, the head (not shown) is provided for pressing and heating the LED chips 2 transferred to the circuit board 5.

The laser light emitter 52 is fixed to the mounting device 150. In the second embodiment, the linear laser light 51 is emitted so as to irradiate one line of LED chips 2. Also, a camera 53 is provided at a position near the laser light emitter 52. The camera 53 recognizes the position of the transfer substrate or the transfer-target substrate, and moves the transfer-target substrate holder 55 in the X, Y, or θ direction to perform alignment. In the illustrated embodiment, the controller 162 can be a computer that includes at least one processor having a CPU (Central Processing Unit), a computer memory having a ROM (Read Only Memory), a RAM (Random Access Memory), and/or a storage device, and the like. The storage device is, for example, a hard disk drive, a semiconductor storage device and the like. The controller 162 is electrically connected to various components of the mounting device 150 to control the mounting device 150. For example, the controller 162 is electrically connected to a driver and/or an actuator of the laser light emitter 52, the camera 53, the transfer substrate holder 54, the transfer-target substrate holder 55, the evacuation component 160 and the header to operate the laser light emitter 52, the camera 53, the transfer substrate holder 54, the transfer-target substrate holder 55, the evacuation component 160, and the header in a manner described in the present disclosure (i.e., a mounting method of the present disclosure).

In the second embodiment, "transfer substrate" refers to the carrier substrate 1 in the above-mentioned first transfer step, to the first transfer substrate 3 in the second transfer step, or to the second transfer substrate 4 in the first mounting step, and "transfer-target substrate" refers to the first transfer substrate 3 in the first transfer step, to the second transfer substrate 4 in the second transfer step, or to the circuit board 5 in the first mounting step.

That is, in the first transfer step, the carrier substrate 1 is held by the transfer substrate holder 54, and the first transfer substrate 3 is held by the transfer-target substrate holder 55. In the second transfer step, the first transfer substrate 3 is turned around front to back and held by the transfer substrate holder 54, and the second transfer substrate 4 is held by the transfer-target substrate holder 55, while in the first mounting step, the second transfer substrate 4 is turned around front to back and held by the transfer substrate holder 54, and the circuit board 5 is held by the transfer-target substrate holder 55.

As described above, in the second transfer step, if the first transfer substrate 3 is disposed on the lower side, it may be held by the transfer-target substrate holder 55, and the second transfer substrate 4 may be held on the transfer substrate holder 54 on the upper side. In this case, in the first mounting step, the second transfer substrate 4 may still be held by the transfer substrate holder 54 on the upper side, and the circuit board 5 may be held by the transfer-target substrate holder 55. In the second transfer step, the first transfer substrate 3 is held by the transfer substrate holder 54 on the upper side and the second transfer substrate 4 is held by the transfer-target substrate holder 55 on the lower side, and when the second transfer step is performed, the second transfer substrate 4 may still be held by the transfer-target substrate holder 55 on the lower side and the circuit board 5 may be held by the transfer substrate holder 54 on the upper side, and the first mounting step performed.

If transfer is performed without having a gap between the LED chips 2 held on the transfer substrate and the transfer-target substrate, the transfer-target substrate holder 55 is moved in the Z direction, and the transfer-target substrate and the LED chips 2 held on the transfer substrate held by the transfer substrate holder 54 are brought into contact. In this case, the transfer substrate holder 54 and the transfer-target substrate holder 55 being irradiated with the laser light as described below do not move in the X direction.

In the second transfer step, which is performed with a gap between the transfer-target substrate and the LED chips 2 held on the transfer substrate, and in the first mounting step, in a state in which the transfer substrate holder 54 holding the transfer substrate moves at each speed in the X direction, and in which the transfer-target substrate holder 55 moves at each speed in the X direction, the laser light emitter 52 emits the linear laser light 51, and the plurality of LED chips 2 in one line are separated and urged to be transferred to the transfer-target substrate held by the transfer-target substrate holder 55. Here, in at least the second transfer step and the first mounting step, the evacuation component 160 maintains the inside of the vacuum chamber of the transfer device 50 under a vacuum.

In the second transfer substrate disposition step, the second transfer substrate rotation step, and the circuit board disposition step, each substrate can be disposed or rotated by a conveyance component (not shown) made up of a robot or the like.

In the second embodiment, the configuration is such that the steps are performed by a single mounting device 150, but this is not necessarily the only option, and changes can be made as needed. For instance, the configuration may be such that three mounting devices 150 are provided, and the first transfer step, the second transfer step, and the first mounting step are each performed by a mounting device 150. Here again, in the second transfer substrate disposition step, the second transfer substrate rotation step, and the circuit board disposition step, each substrate may be disposed or rotated by a conveyance component (not shown) made up of a robot or the like.

Also, in the second embodiment, the configuration is such that the laser light emitter 52 is fixed to the mounting device 150, and the transfer substrate holder 54 and the transfer-target substrate holder 55 are moved, but this is not necessarily the only option, and changes can be made as needed according to the device. For instance, the transfer substrate holder 54 may be fixed to the mounting device 150, and the laser light emitter 52 and the transfer-target substrate holder 55 may be moved, or the transfer-target substrate holder 55 may be fixed to the mounting device 150, and the laser light emitter 52 and the transfer substrate holder 54 may be moved.

Thus, in the second embodiment, the influence of air resistance during transfer can be eliminated, allowing LED chips to be transferred and mounted very accurately, and allowing the plurality of LED chips in one line to be transferred and mounted at high speed, by a mounting method for mounting diced LED chips, the first surface of which is held on a carrier substrate, on a circuit board, the method comprising:

a first transfer step of separating the LED chips from the carrier substrate, transferring a second surface side on the opposite side from the first surface of the LED chips to a first transfer substrate, and holding the LED chips there;

a second transfer substrate disposition step of disposing a second transfer substrate so as to face, across a gap, the first surface of the LED chips, the second surface of which is held on the first transfer substrate;

a second transfer step of irradiating the first transfer substrate with a linear laser light to separate the plurality of the LED chips in one line from the first transfer substrate and urge these LED chips toward the second transfer substrate, moving the first transfer substrate and the second transfer substrate relative to each other at different speeds and in a direction perpendicular to the linear laser light, and thereby transferring the first surface side of the LED chips to the second transfer substrate;

a second transfer substrate rotation step of disposing the second transfer substrate by rotating the second transfer substrate by 90° around its normal line with respect to the linear laser light;

a circuit board disposition step of disposing the circuit board so as to face, across a gap, the second surface of the LED chips, the first surface of which is held on the second transfer substrate; and a first mounting step of irradiating the second transfer substrate with a linear laser light to separate the plurality of the LED chips in one line from the second transfer substrate and urge the LED chips toward the circuit board, moving the second transfer substrate and the circuit board relative to each other at different speeds and in a direction perpendicular to the linear laser light, and thereby transferring the second surface side of the LED chips to the circuit board, so that bumps on the LED chips are joined to electrodes on the circuit board, wherein at least the second transfer step and the first mounting step are performed in a vacuum.

Also, in the second embodiment, the influence of air resistance during transfer can be eliminated, allowing LED chips to be transferred and mounted very accurately, and allowing the plurality of LED chips in one line to be transferred and mounted at high speed, by a mounting device for mounting LED chips on a circuit board, the device comprising:

an evacuation component that puts the interior of the mounting under a vacuum;

a laser light emitter that irradiates the transfer substrate on which the LED chips are arranged with a linear laser light;

a transfer substrate holder that holds the transfer substrate and is movable in a first direction;

a transfer-target substrate holder that holds the transfer-target substrate or the circuit board so as to face, across a gap, the LED chips held on the transfer substrate, and is movable in at least the first direction; and a controller that controls the laser light emitter, the transfer substrate holder, and the transfer-target substrate holder, wherein the controller relatively moves the transfer substrate and the transfer-target substrate or the circuit board at mutually different speeds in a direction perpendicular to the linear laser light, so that the plurality of LED chips in one line corresponding to the linear laser light are separated, urged, and transferred to the transfer-target substrate or the circuit board.

Third Embodiment

Figure 10:
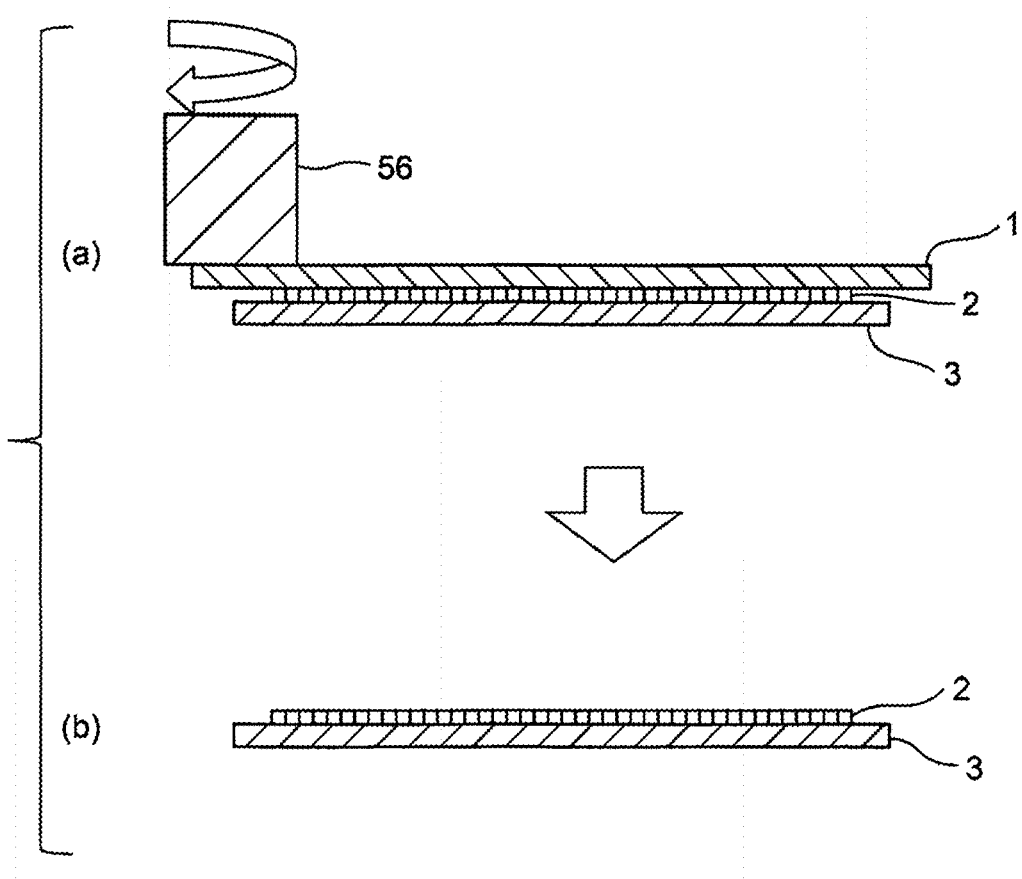
FIG. 10 is a diagram illustrating a first transfer step of a mounting method in a third embodiment of the present invention.

In a third embodiment of the present invention, the first transfer step is different from that in the second embodiment. The mounting method in the third embodiment of the present invention will be described with reference to FIG. 10. FIG. 10 is a diagram illustrating the first transfer step of the mounting method in the third embodiment of the present invention.

In the first transfer step in the third embodiment, first, the second surface of the LED chips 2, the first surface of which is held by the carrier substrate 1, is transferred by being stuck onto an adhesive layer (not shown) on the surface of the first transfer substrate 3. Next, as shown in part (a) of FIG. 10, the opposite side of the carrier substrate 1 from the side holding the LED chips 2 is subjected to back grinding with a grinder 56. That is, the carrier substrate 1 is removed by scraping it off of the opposite side from the side where the LED chips 2 are provided. Particularly in the case of red LEDs, laser lift-off cannot be applied, so this back grinding method is used.

As a result of the back grinding, the LED chips 2 are held by the adhesiveness of the transfer layer of the first transfer substrate 3, and the LED chips 2 are transferred to and held on the first transfer substrate 3 as shown in part (b) of FIG. 10. The first transfer step in the third embodiment may be carried out by providing the grinder 56 to the mounting device 150, or by placing a back grinding device provided with the grinder 56 at some point ahead of the mounting device 150.

As described above, in the third embodiment, when laser lift-off is not used, the first transfer step can be performed by a back grinding method.

Fourth Embodiment

Figure 11:
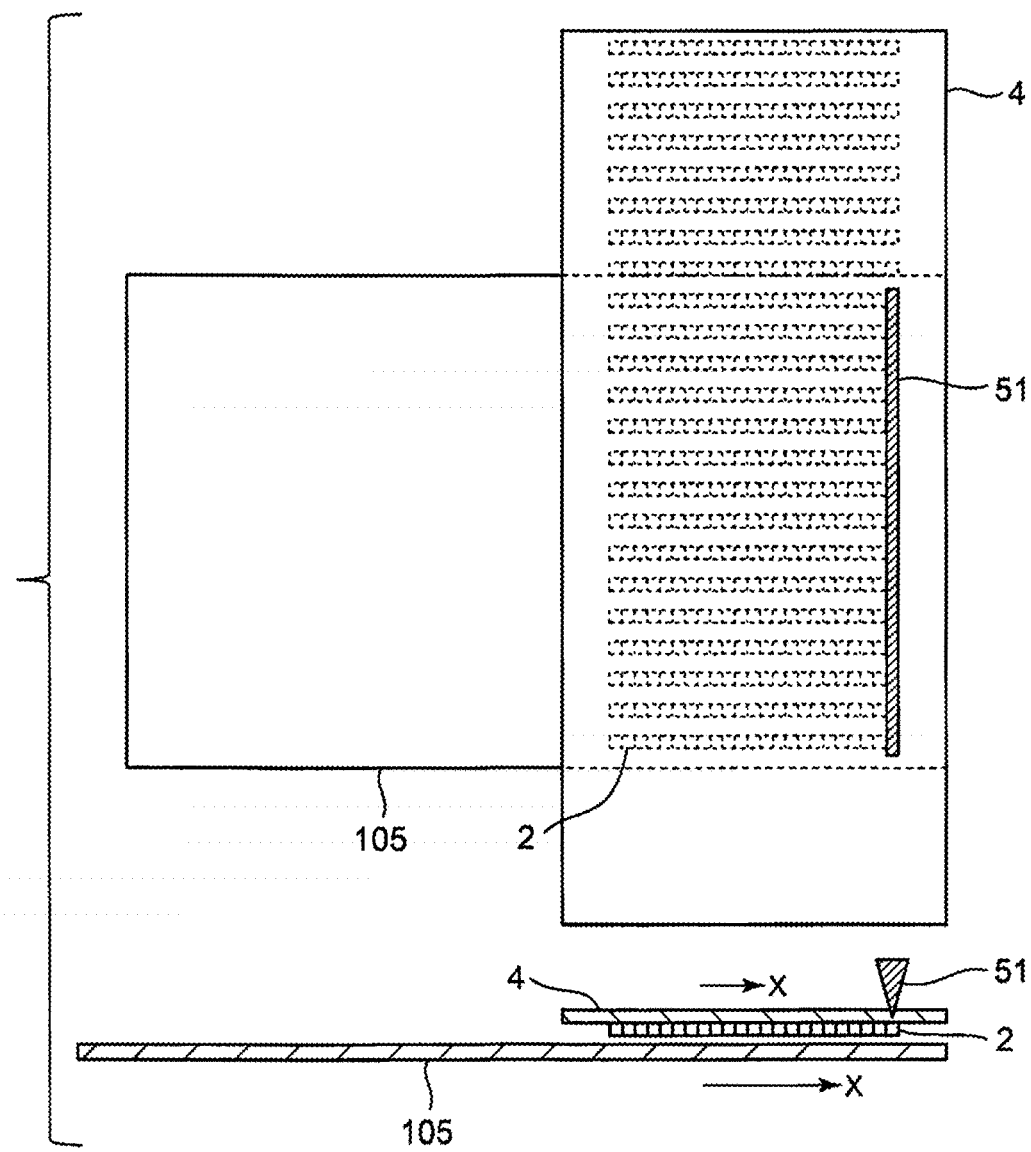
FIG. 11 is a diagram illustrating the beginning of a third transfer step of a mounting method in a fourth embodiment of the present invention.
Figure 12:
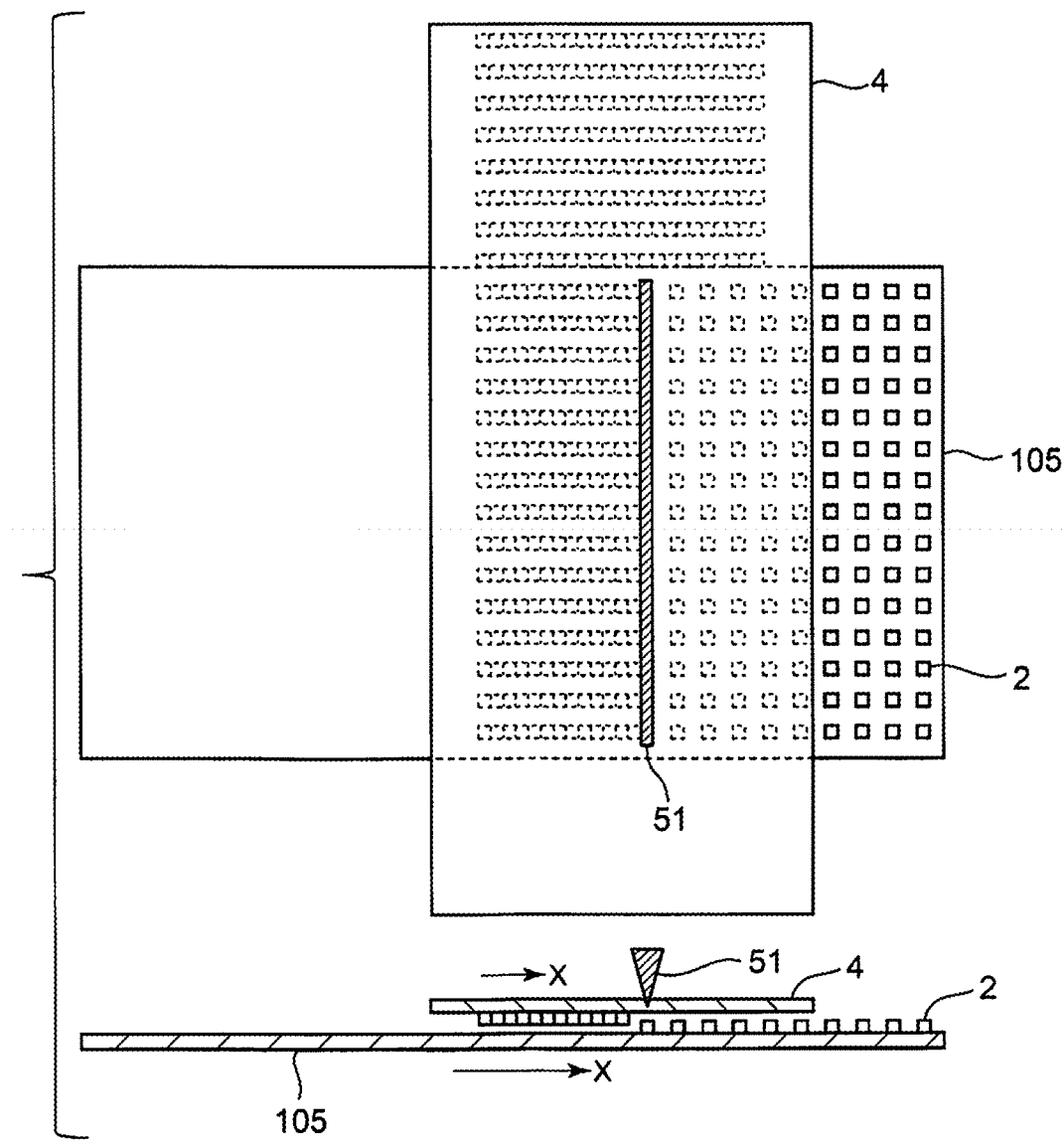
FIG. 12 is a diagram illustrating the middle of the third transfer step of the mounting method in the fourth embodiment of the present invention.
Figure 13:
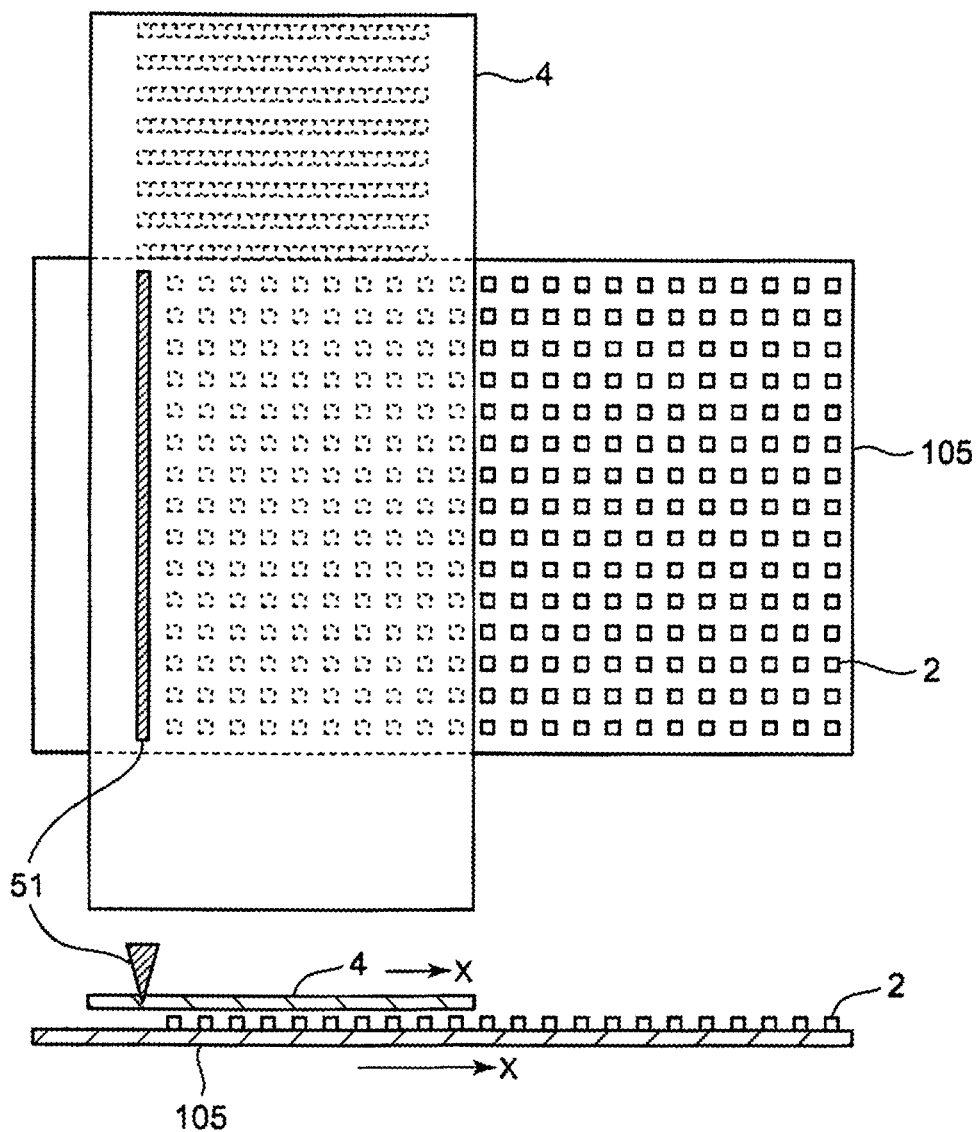
FIG. 13 is a diagram illustrating the end of the third transfer step of the mounting method in the fourth embodiment of the present invention.
Figure 14:
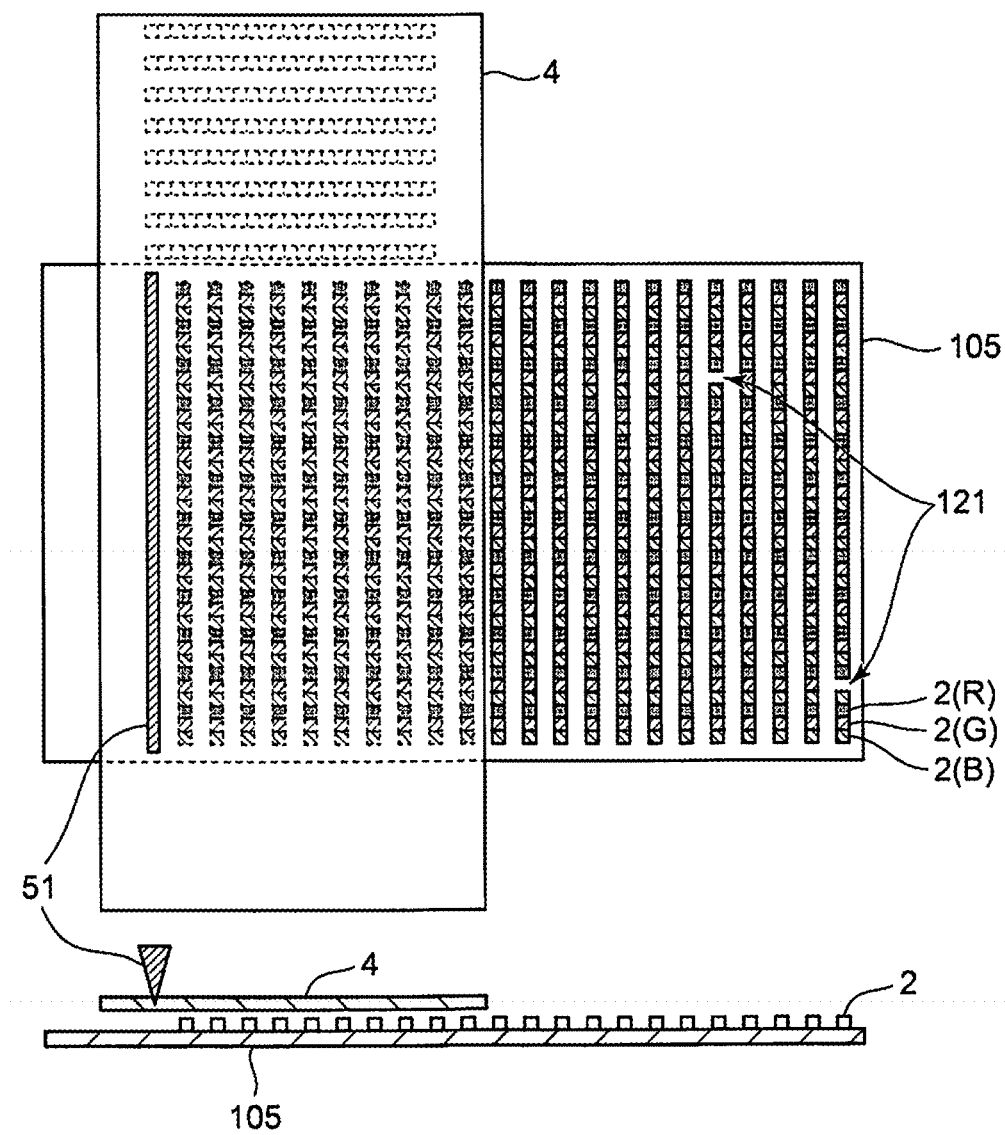
FIG. 14 is a diagram illustrating repair by the mounting method in the fourth embodiment of the present invention.
Figure 15:
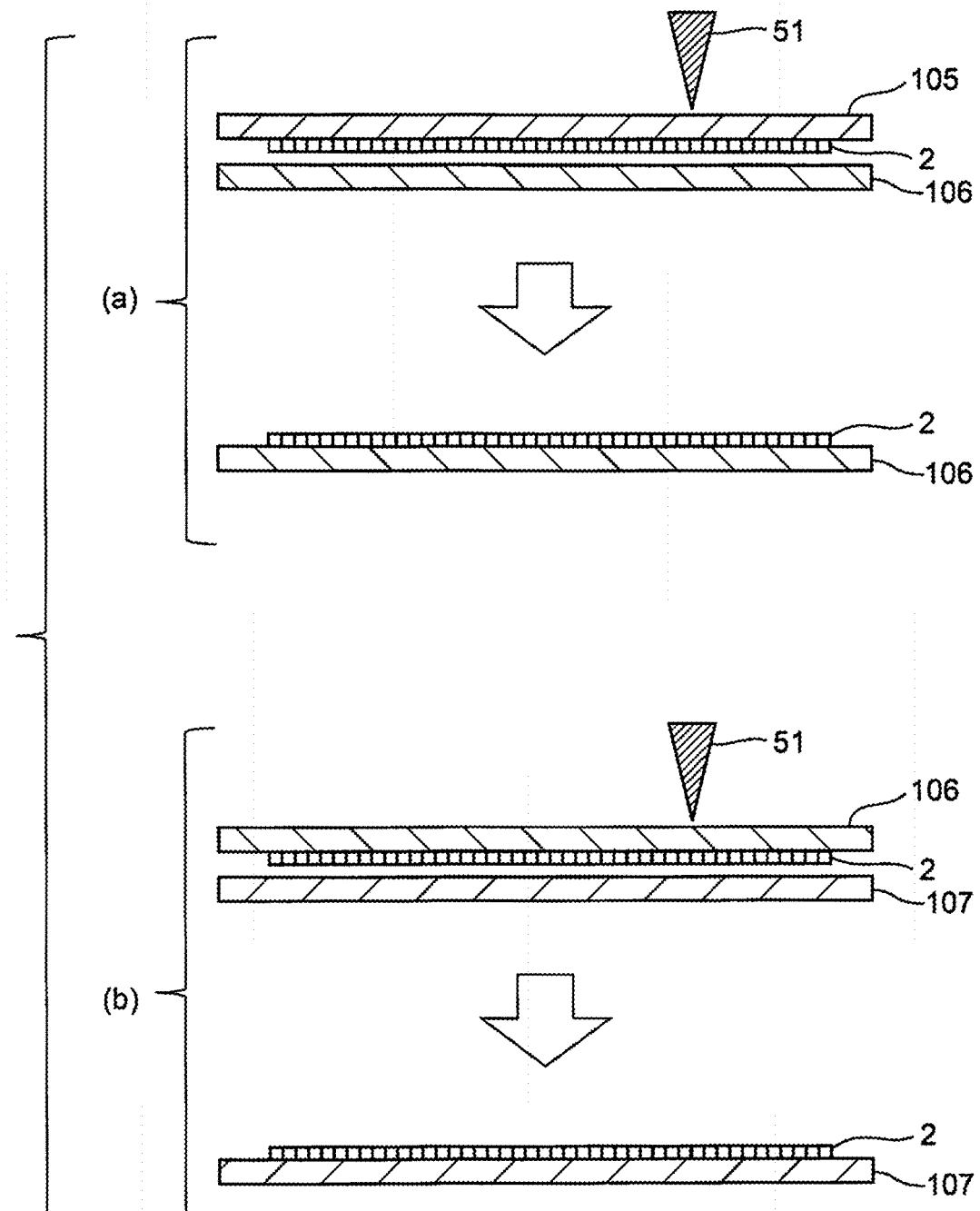
FIG. 15 is a diagram illustrating a fourth transfer step and a second mounting step of the mounting method in the fourth embodiment of the present invention.
Figure 16:
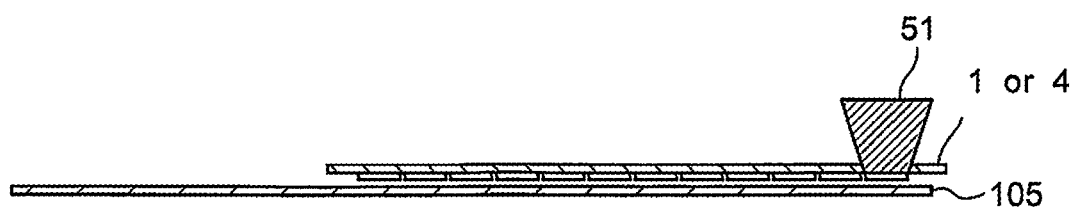
FIG. 16 is a diagram illustrating LED chip transfer during repair by the mounting method in the fourth embodiment of the present invention.

In a fourth embodiment of the present invention, the step after the second transfer substrate rotation step is different from that in the second embodiment. The fourth embodiment will be described with reference to FIGS. 11 to 16. FIG. 11 is a diagram illustrating the beginning of a third transfer step of the mounting method in the fourth embodiment of the present invention. FIG. 12 is a diagram illustrating the middle of the third transfer step of the mounting method in the fourth embodiment of the present invention. FIG. 13 is a diagram illustrating the end of the third transfer step of the mounting method in the fourth embodiment of the present invention. FIG. 14 is a diagram illustrating repair by the mounting method in the fourth embodiment of the present invention. FIG. 15 is a diagram illustrating a fourth transfer step and a second mounting step of the mounting method in the fourth embodiment of the present invention. FIG. 16 is a diagram illustrating LED chip transfer during repair by the mounting method in the fourth embodiment of the present invention.

The fourth embodiment is mainly performed when repair is required. That is, the third transfer substrate disposition step, the third transfer step, the repair step, the fourth transfer substrate disposition step, the fourth transfer step, the circuit board disposition step, and the second mounting step are performed in that order after the second transfer substrate rotation step.

After the second transfer substrate rotation step, the third transfer substrate disposition step is performed. In the third transfer substrate disposition step, a third transfer substrate 105 is disposed such that its first surface faces, across a gap, the second surface of the LED chips 2 held on the second transfer substrate 4 (FIG. 11). At this point, in the fourth embodiment, the second transfer substrate 4 is disposed on the upper side with the LED chips 2 held facing downward, and the third transfer substrate 105 is disposed on the lower side. The third transfer substrate disposition step may or may not be performed in a vacuum.

Next, the third transfer step is performed in a vacuum. As shown in FIG. 11, the second transfer substrate 4 is moved in the X direction at a third speed, and the third transfer substrate 105 is moved in the X direction at a fourth speed that is faster than the third speed. The moving second transfer substrate 4 is irradiated with the linear laser light 51 to reduce the adhesive strength of the transfer layer, thereby separating the plurality of LED chips 2 in one line in the Y direction from the second transfer substrate 4, and the LED chips 2 are urged toward the third transfer substrate 105 by the urging force produced by decomposition of the transfer layer, so that the second surface side is transferred. A transfer layer (not shown) is provided to the third transfer substrate 105, and this transfer layer is solidified by the heat of the incoming LED chips 2 and held in place. When the second surface side of the transferred LED chip 2 is transferred to the third transfer substrate 105, the bumps of the LED chips 2 are facing the third transfer substrate 105 side.

While the second transfer substrate 4 is moved at the third speed in the X direction and the third transfer substrate 105 is moved at the fourth speed, which is faster than the third speed, in the X direction, the second transfer substrate 4 is irradiated with the linear laser light 51 in the Y direction to separate and transfer the plurality of LED chips 2 in one line, which allows the LED chips 2 that were arranged in the X direction at the second pitch and in the Y direction at the third pitch on the second transfer substrate 4 that was rotated by 90° in the second transfer substrate rotation step to be transferred to the third transfer substrate 105 such that they are arranged in the X direction at a fourth pitch that is wider than the second pitch and in the Y direction at a third pitch. This third pitch and fourth pitch can be the pitch of the LED chips on a circuit board constituting a display.

FIGS. 11 to 13 show how the LED chips 2 are transferred while the second transfer substrate 4 and the third transfer substrate 105 transfer are each moving in the X direction. FIG. 11 shows what happens at the beginning of the third transfer step, FIG. 12 shows what happens in the middle of the third transfer step, and FIG. 13 shows what happens at the end of the third transfer step.

Also, the third transfer step is performed in a vacuum as mentioned above. Performing the third transfer step in a vacuum prevents the LED chips 2 that have been separated from the second transfer substrate 4 and urged from being subjected to air resistance and transferred to the wrong position on the third transfer substrate 105. In order to further prevent positional deviation, it is preferable for the gap between the second transfer substrate 4 and the third transfer substrate 105 to be as narrow as possible. In the fourth embodiment, the distance is set by adding a slight clearance to the height of the LED chips 2.

As discussed above, performing the third transfer step results in the LED chips 2 being arranged on the third transfer substrate 105 in the X direction at the fourth pitch that is wider than the second pitch and in the Y direction at the third pitch that is wider than the first pitch. LED chips 2 of a second type can be arranged in a line in the Y direction by performing the third transfer step again after moving the third transfer substrate 105 or the second transfer substrate 4 in the Y direction by the first pitch, that is, by at least the length in the Y direction of the LED chips. That is, the third transfer step is performed again so that new LED chips 2 will be disposed between the LED chips in the longitudinal direction of the linear laser light already transferred onto the third transfer substrate 105 in the third transfer step, which allows a second type of LED chips 2 to be arranged in a line in the Y direction. Similarly, performing the third transfer step for a third time allows a third type of LED chips 2 to be arranged in a line in the Y direction.

Here, if the first speed and the second speed are set in the above-mentioned second transfer step so that the third pitch is three times the first pitch, three types of LED chips 2 can be arranged, allowing them to be arranged with substantially no gap in the Y direction. If the first type of LED chips 2 are red LED chips 2 (R), the second type of LED chips 2 are green LED chips 2 (G), and the third type of LED chips 2 are blue LED chips 2 (B), then red, green, and blue LED chips 2 can be arranged without any gap in between them (see FIG. 14).

Here, by performing the third mounting step a second time by shifting the second transfer substrate 4 or the third transfer substrate 105 by the first pitch in the Y direction, a second type of LED chips 2 can be transferred to the third transfer substrate 105 such that the LED chips 2 held on the second transfer substrate 4 pass by the side of, rather than over, the LED chips 2 already transferred to the third transfer substrate 105. Therefore, the gap between the second transfer substrate 4 and the third transfer substrate 105 can be set to a gap obtained by adding a slight clearance to the height of the LED chips 2, which prevents positional deviation when the LED chips 2 fall, and allows for stable and very accurate transfer.

However, when transferring to the third transfer substrate 105 due to failure in transfer or the like, positional deviation or dropouts 121 of the LED chips 2 may occur as shown in FIG. 14. If this happens, a repair step is performed. In this repair step, as shown in FIG. 16, the carrier substrate 1 or the second transfer substrate 4 and the third transfer substrate face each other across a gap, and the carrier substrate 1 or the second transfer substrate 4 is irradiated with the laser light in a vacuum, thereby performing repair by transferring the LED chips 2 one at a time to the third transfer substrate 105. Of course, if there is an improperly positioned LED chip 2 on the third transfer substrate 105, it is removed in advance with a head or the like.

Thus, at the third transfer substrate 105, the LED chips 2 are merely held on the transfer layer, so it is easy to remove any improperly positioned LED chips 2. For example, it is difficult to remove an LED chip 2 mounted on the circuit board 5 as in the second embodiment, but the LED chips 2 on the third transfer substrate 105 in the fourth embodiment are easy to remove and therefore lend themselves to a repair step.

Next, a fourth transfer substrate disposition step is performed in which a fourth transfer substrate 106 is disposed so as to face, across a gap, the first surface of the LED chips 2, the second surface of which is held on the repaired third transfer substrate 105 (see part (a) of FIG. 15). At this point, in the fourth embodiment, the third transfer substrate 105 is disposed on the upper side with the LED chips 2 held facing downward, and the fourth transfer substrate 106 is disposed on the lower side. The fourth transfer substrate disposition step may or may not be performed in a vacuum.

Next, a fourth transfer step is performed in which the third transfer substrate 105 is irradiated with a linear laser light to separate the LED chips 2 from the third transfer substrate 105 and urge the LED chips 2 toward the fourth transfer substrate 106, so that the first surface side of the LED chips 2 is transferred to the fourth transfer substrate 106 (see part (a) of FIG. 15). When the first surface side of the transferred LED chips 2 is transferred to the fourth transfer substrate 106, the bumps on the LED chips 2 are on the opposite side from the fourth transfer substrate 106, that is, they are facing outward. This fourth transfer step is performed in a vacuum.

In the fourth embodiment, the fourth transfer step is performed in a vacuum, but this is not necessarily the only option, and changes can be made as needed. For instance, if the fourth transfer step is performed in a state in which the first surface side of the LED chips 2 held on the third transfer substrate 105 in contact with the fourth transfer substrate 106, air resistance will have no effect when the chips are urged, so this step may be performed at atmospheric pressure rather than in a vacuum.

In the fourth transfer step, the plurality of LED chips 2 in one row are transferred to the fourth transfer substrate 106 by irradiation with a linear laser light, while the RGB LED chips 2 are still arranged at the fourth pitch in the X direction and at the first pitch in the Y direction.

Next, a circuit board disposition step is performed in which the circuit board 107 is disposed so as to face, across a gap, the second surface of the LED chips 2 held on the fourth transfer substrate 106 (see part (b) of FIG. 15). At this point, in the fourth embodiment, the fourth transfer substrate 106 is disposed on the upper side with the held LED chips 2 facing downward, and the circuit board 107 is disposed on the lower side. The circuit board disposition step may or may not be carried out in a vacuum.

Next, the second mounting step is performed in a vacuum (see part (b) of FIG. 15). In the second mounting step, the LED chips 2 are separated from the fourth transfer substrate 106 by irradiating the fourth transfer substrate 106 with a linear laser light, and the LED chips 2 are urged toward the circuit board 107, the second surface side of the LED chips 2 is transferred to the circuit board 107, and the bumps provided to the second surface of the LED chips 2 are brought into contact with the circuit board 107 to accomplish mounting. After this, the LED chips 2 held on the circuit board 107 may be pressed and heated with a head or the like so that the bumps of the LED chips 2 and the electrodes of the circuit board 107 are securely joined.

In the fourth embodiment, the configuration is such that the second mounting step is performed in a vacuum, but this is not necessarily the only option, and changes may be made as needed. For instance, if the second mounting step is performed in a state in which the second surface side of the LED chips 2 held on the fourth transfer substrate 106 has been brought into contact with the circuit board 107, air resistance will have no effect during the urging of the chips, so this step may be performed at atmospheric pressure rather than in a vacuum.

Thus, in the fourth embodiment, repair of any LED chips 2 that are missing or are out of position can be carried out on the transfer substrate, and it is possible to perform stable mounting.

Fifth Embodiment

Figure 17:
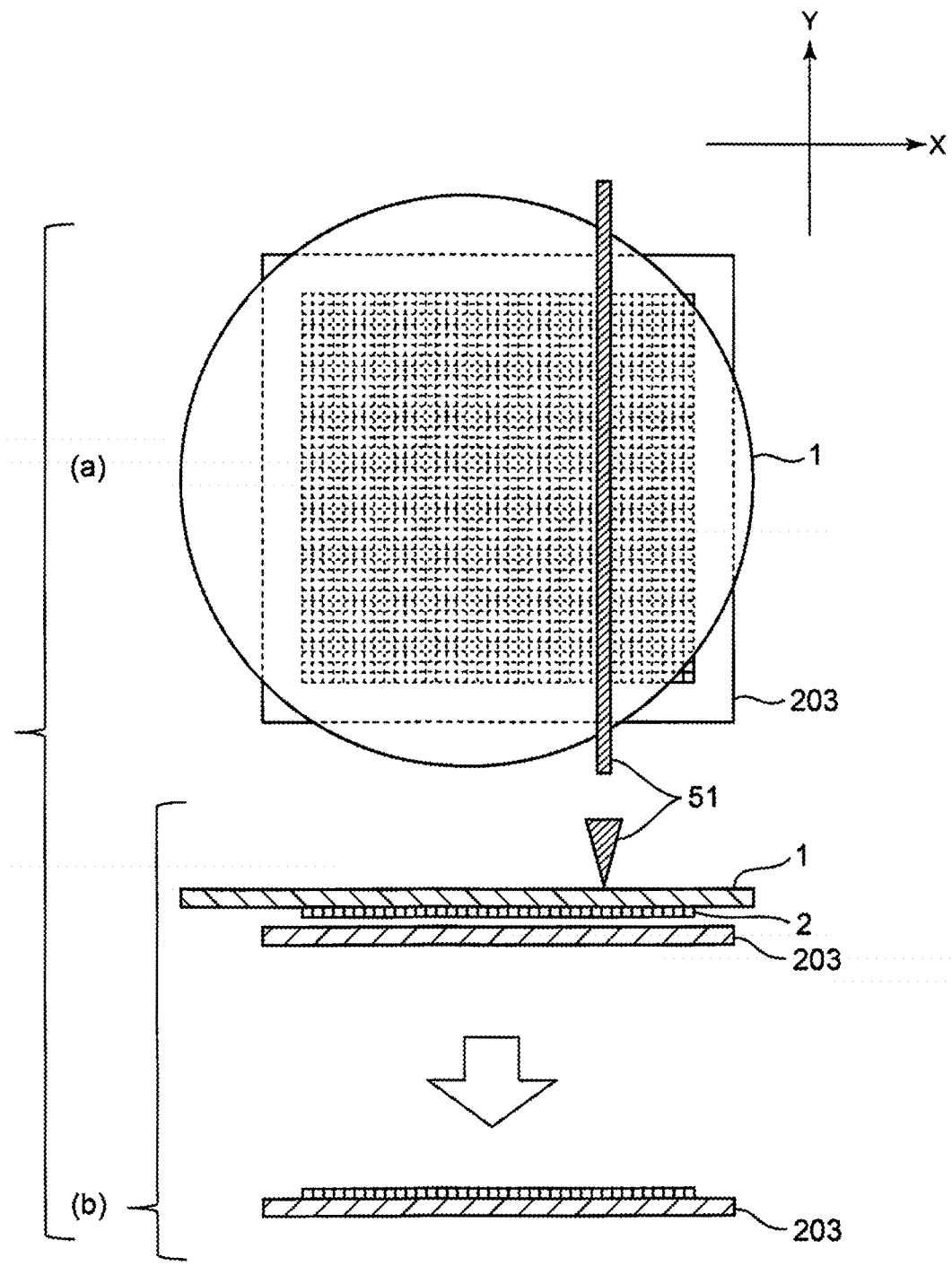
FIG. 17 is a diagram illustrating a first-A transfer step of a mounting method in a fifth embodiment of the present invention.
Figure 18:
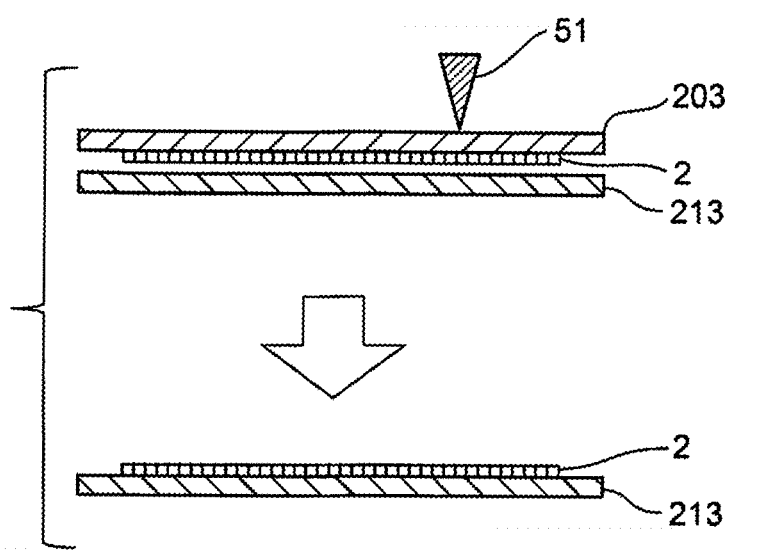
FIG. 18 is a diagram illustrating a first-B transfer step of the mounting method in the fifth embodiment of the present invention.
Figure 19:
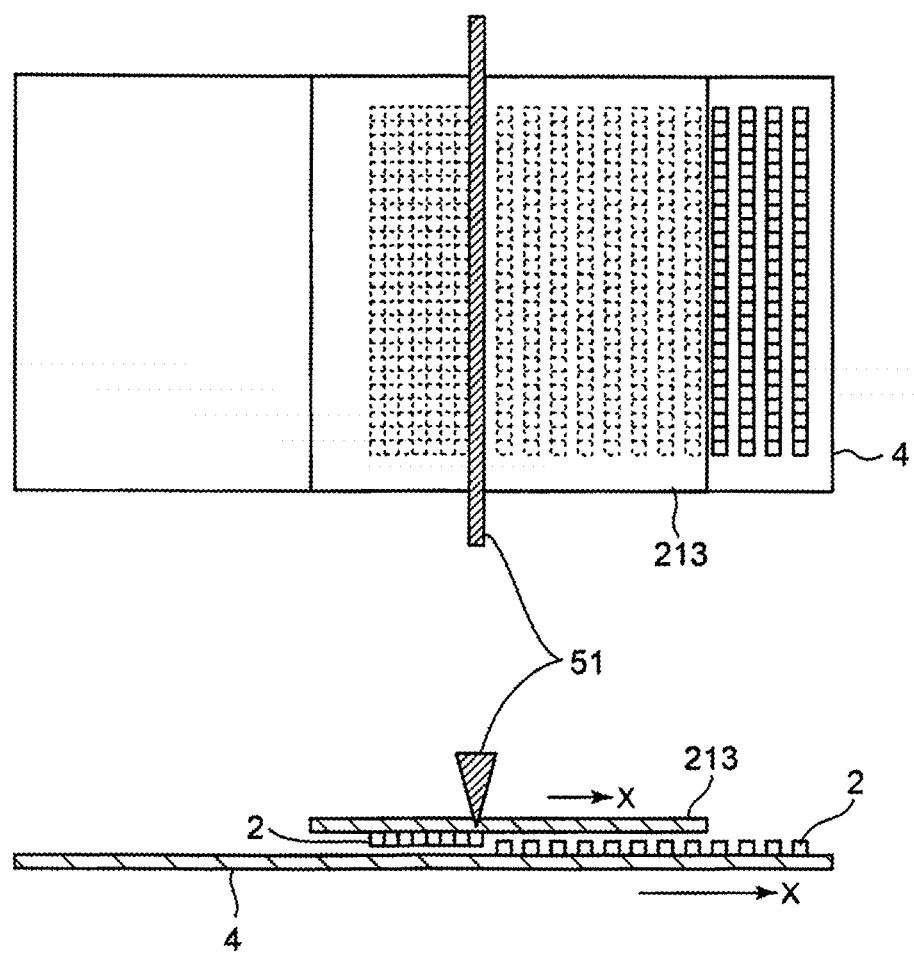
FIG. 19 is a diagram illustrating a second transfer step of the mounting method in the fifth embodiment of the present invention.
Figure 20:
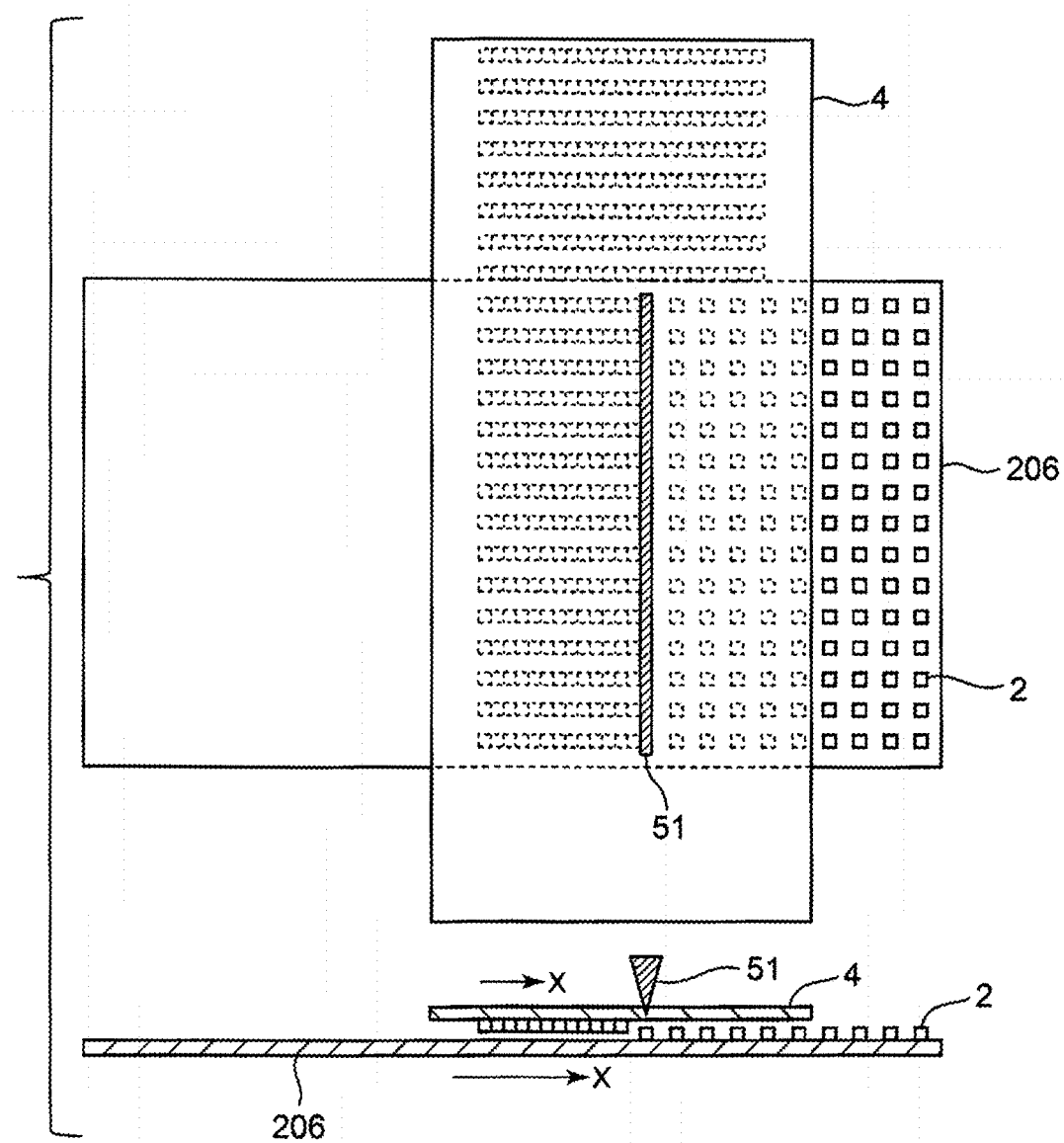
FIG. 20 is a diagram illustrating a third transfer step of the mounting method in the fifth embodiment of the present invention.
Figure 21:
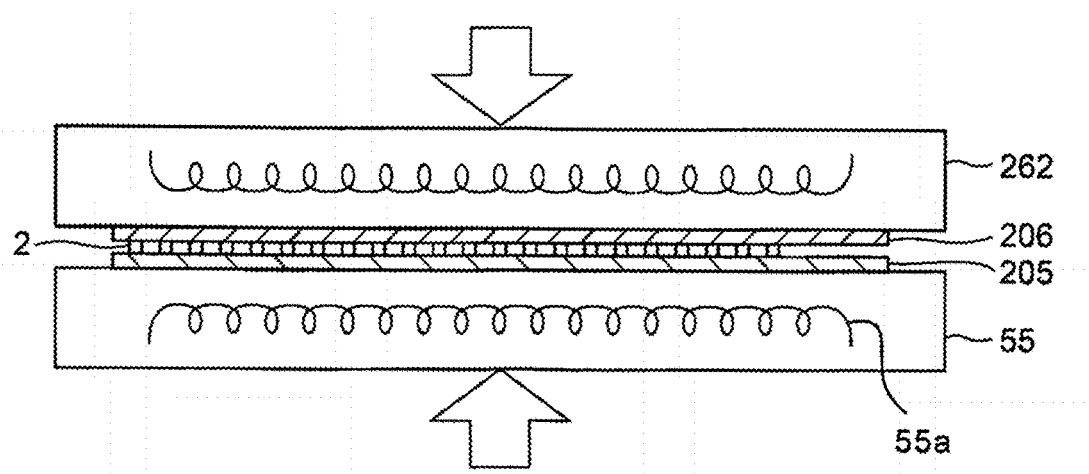
FIG. 21 is a diagram illustrating a thermocompression bonding step of the mounting method in the fifth embodiment of the present invention.
Figure 22:
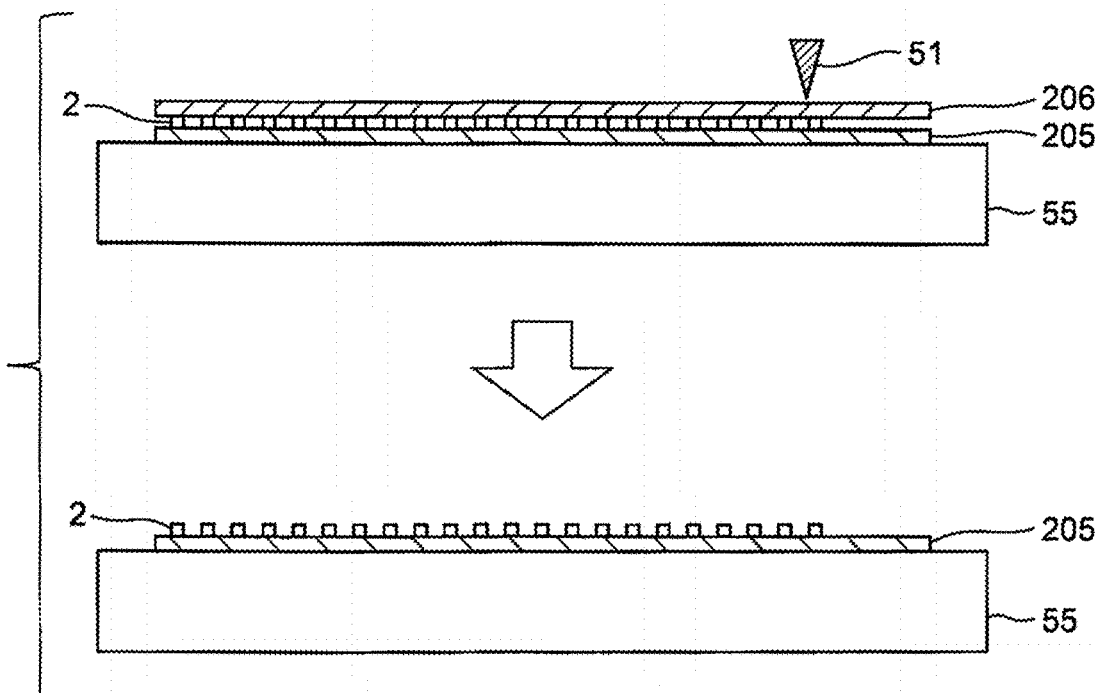
FIG. 22 is a diagram illustrating a third transfer substrate removal step of the mounting method in the fifth embodiment of the present invention.

A fifth embodiment differs from the first to fourth embodiments in that the transfer substrate is removed after the LED chips held on the transfer substrate have been thermocompression bonded to the circuit board. The mounting method in the fifth embodiment of the present invention will be described with reference to FIGS. 17 to 22. FIG. 17 is a diagram illustrating a first-A transfer step of the mounting method in the fifth embodiment of the present invention. FIG. 18 is a diagram illustrating a first-B transfer step of the mounting method in the fifth embodiment of the present invention. FIG. 19 is a diagram illustrating a second transfer step of the mounting method in the fifth embodiment of the present invention. FIG. 20 is a diagram illustrating a third transfer step of the mounting method in the fifth embodiment of the present invention. FIG. 21 is a diagram illustrating a thermocompression bonding step of the mounting method in the fifth embodiment of the present invention. FIG. 22 is a diagram illustrating a third transfer substrate removal step of the mounting method in the fifth embodiment of the present invention.

Mounting Method

First, the first-A transfer step is performed to separate the LED chips 2 from the carrier substrate 1, and the second surface side of the LED chips 2 is transferred to and held on the first-A transfer substrate 203. In the fifth embodiment, as shown in part (a) of FIG. 17, the carrier substrate 1 is irradiated with a laser light 51 consisting of a linear excimer laser, and either the carrier substrate 1 or the linear laser light 51 is moved relatively in the X direction, so that the entire carrier substrate 1 is irradiated with the laser light. Then, a part of the GaN layer in the carrier substrate 1, which is composed of sapphire, is broken down into gallium and nitrogen, and the LED chips 2 are separated and urged toward the first-A transfer substrate 203. This method is called laser lift-off, and the separated LED chips 2 are urged by generation of nitrogen when the GaN decomposes, and are transferred to the first-A transfer substrate 203.

In the illustrated embodiment, as shown in part (b) of FIG. 17, a gap is provided between the LED chips 2 and the first-A transfer substrate 203 when the laser light 51 is emitted, but this gap is not necessarily required, and the configuration may be such that the laser light 51 is emitted in a state in which the LED chips 2 and the first-A transfer substrate 203 are touching with each other. Not providing this gap prevents the LED chips 2 from being urged under the influence of air resistance, which would lead to positional deviation. Also, this first-A transfer step may be carried out in a vacuum. If the step is conducted in a vacuum, then even if the above-mentioned gap is provided, the LED chips 2 will not be subjected to air resistance when being urged, thus preventing positional deviation.

A transfer layer (not shown) is provided in advance on the surface of the first-A transfer substrate 203, the transferred LED chips 2 are held by this transfer layer, and as shown in part (b) of FIG. 17, the LED chips 2 are held on the first-A transfer substrate 203. Here, the "transfer layer" is one that has adhesiveness at normal temperature, is solidified by heat or ultraviolet light, and decomposes and generates gas upon irradiation with laser light. That is, after the LED chips 2 are urged toward the transfer layer of the first-A transfer substrate 203 having adhesiveness and have landed there, the transfer layer of the first-A transfer substrate 203 is solidified by the heat of the LED chips 2, and the LED chips 2 are held in place. If the heat of the LED chips 2 is too low, the transfer layer may be heated after the LED chips 2 have landed. At this point, bumps on the second surface of the LED chips 2 are in contact with the first-A transfer substrate 203.

Next, the first-B transfer step is performed. As shown in FIG. 18, the first-A transfer substrate 203 is disposed so that the first surface of the LED chips 2 faces the first-B transfer substrate 213. Then, the LED chips 2 are separated from the first-A transfer substrate 203, and the first surface side of the LED chips 2 is transferred to and held on the first-B transfer substrate 213. In the fifth embodiment, the first-A transfer substrate 203 is irradiated with a laser light 51 consisting of an excimer laser in a linear shape, and either the first-A transfer substrate 203 or the linear laser light 51 is moved relatively in the X direction, so that the entire first-A transfer substrate 203 is irradiated with laser light. Then, the adhesive strength of the transfer layer is reduced, the LED chips 2 are separated and urged toward the first-B transfer substrate 213, and the first surface side of the LED chips 2 is transferred to the first-B transfer substrate 213. This first-B transfer step may be carried out in a vacuum. If the step is conducted in a vacuum, then even if the above-mentioned gap is provided, the LED chips 2 will not be subjected to air resistance when being urged, thus preventing positional deviation. At this point, the first surface of the LED chips 2 is in contact with the first-B transfer substrate 213.

Next, a second transfer substrate disposition step is performed. That is, the second transfer substrate 4 is disposed so as to face, across a gap, the second surface of the LED chips 2, the first surface of which is held by the first-B transfer substrate 213. At this point, in the fifth embodiment, the first-B transfer substrate 213 is disposed on the upper side with the held LED chips 2 facing downward, and the second transfer substrate 4 is disposed on the lower side of the first-B transfer substrate 213 (see FIG. 19). The second transfer substrate disposition step may be performed in a vacuum, but does not necessarily have to be in a vacuum.

The second transfer step is then performed in a vacuum. That is, the first-B transfer substrate 213 is moved in the X direction at a first speed, and the second transfer substrate 4 is moved in the X direction at a second speed that is faster than the first speed. Furthermore, the moving first-B transfer substrate 213 is irradiated with the laser light 51 in a linear shape along the Y direction to reduce the adhesive strength of the transfer layer, and the plurality of LED chips 2 in one line in the Y direction are separated from the first-B transfer substrate 213. Here, just as in the first-B transfer step, the separated LED chips 2 are urged toward the second transfer substrate 4, and the second surface side of the LED chips 2 is transferred.

As shown in FIG. 19, while the first-B transfer substrate 213 is moved in the X direction at the first speed and the second transfer substrate 4 is moved in the X direction at the second speed that is faster than the first speed, the laser light 51 is emitted in a linear shape along the Y direction of the first-B transfer substrate 213 to separate the plurality of LED chips 2 in one line and urge them toward the second transfer substrate 4, which allows the LED chips 2 arranged in the X direction at the first pitch and in the Y direction at the second pitch on the first-B transfer substrate 213 to be arranged on and transferred to the second transfer substrate 4 in the X direction at the third pitch that is wider than the first pitch, and in the Y direction at the second pitch. This third pitch can be the pitch of the LED chips on the circuit board constituting a display. When the second surface side of the transferred LED chips 2 is transferred to the second transfer substrate 4, the bumps of the LED chips 2 are facing the second transfer substrate 4 side.

Performing the second transfer step in a vacuum makes it possible to prevent the LED chips 2 that have been separated from the first-B transfer substrate 213 and urged, from being transferred to the wrong place on the second transfer substrate 4 due to air resistance. Furthermore, in order to prevent positional deviation, it is preferable for the gap between the first-B transfer substrate 213 and the second transfer substrate 4 to be as narrow as possible, and in the second embodiment, the distance is set by adding a slight clearance to the height of the LED chips 2.

In the fifth embodiment, the configuration is such that the first-B transfer substrate 213 and the second transfer substrate 4 are both moved in the X direction during the transfer of the LED chips 2, but this is not necessarily the only option, and changes can be made as needed according to the device. For instance, the configuration may be such that the linear laser light 51 is emitted along the X direction, and the first-B transfer substrate 213 and the second transfer substrate 4 are moved in the Y direction. Also, the configuration may be such that the linear laser light 51 is emitted along the Y direction, the first-B transfer substrate 213 is moved in the X direction, and the second transfer substrate 4 is moved in the −X direction, so that they are moved in opposite directions. That is, the configuration may be such that the first-B transfer substrate 213 and the second transfer substrate 4 are moved relative to each other at different speeds and in a direction perpendicular to the linear laser light 51. This allows the LED chips 2 held on the first-B transfer substrate 213 to be transferred onto the second transfer substrate 4 at different pitches.

In the fifth embodiment, the first-B transfer substrate 213 is disposed on the upper side and the second transfer substrate 4 is disposed on the lower side, but this is not necessarily the only option, changes may be made as needed according to the layout. For instance, the first-B transfer substrate 213 may be disposed on the lower side as it is in the first-B transfer step, the second transfer substrate 4 disposed on the upper side, and the LED chips 2 urged and transferred from the lower first-B transfer substrate 213 to the upper second transfer substrate 4. Also, the second transfer step may be performed in a state in which the first-B transfer substrate 213 and the second transfer substrate 4 face each other across a gap in the Z direction.

Next, a second transfer substrate rotation step is carried out in which the second transfer substrate 4 is rotated by 90° around its normal line and is disposed on the upper side with its LED chip holding side facing downward. Here, rotating the second transfer substrate 4 by 90° around its normal line means rotating the orientation of the second transfer substrate 4 by 90° with respect to the longitudinal direction of the linear laser light. The second transfer substrate rotation step may or may not be performed in a vacuum. Performing the second transfer substrate rotation step results in the second transfer substrate 4, which has been horizontally disposed in the X direction, being rotated by 90° into a vertical disposition, as shown in FIG. 20.

The third transfer substrate disposition step is then performed. That is, the third transfer substrate 206 is disposed so as to face, across a gap, the first surface of the LED chips 2, the second surface of which is held on the second transfer substrate 4. In the fifth embodiment, the second transfer substrate 4 is disposed on the upper side and the third transfer substrate 206 on the lower side so that the held LED chips 2 face downward (see FIG. 20). This third transfer substrate disposition step may also be performed in a vacuum, but this is not necessarily required.

Next, the third transfer step is performed in a vacuum. That is, the second transfer substrate 4 is moved in the X direction at a third speed, and the third transfer substrate 206 is moved in the X direction at a fourth speed that is faster than the third speed. The moving second transfer substrate 4 is irradiated with the linear laser light 51 along the Y direction to decompose the transfer layer and to separate the plurality of LED chips 2 in one line in the Y direction from the second transfer substrate 4, and urge them toward the third transfer substrate 206. The first surface side of the LED chips 2 is then transferred to the third transfer substrate 206. At this point, the bumps on the second surface of the LED chips 2 are facing outward on the opposite side from the third transfer substrate 206 side.

Here, as shown in FIG. 20, while the second transfer substrate 4 is moved in the X direction at the third speed and the circuit board 5 is moved in the X direction at the fourth speed that is faster than the third speed, the linear laser light 51 is emitted in the Y direction of the second transfer substrate 4 to separate and urge the plurality of LED chips 2 in one line, so that the LED chips 2 disposed at the second pitch in the X direction and at the third pitch in the Y direction on the second transfer substrate 4, which was already rotated by 90° in the second transfer substrate rotation step, can be transferred such that they are disposed at the third pitch in the Y direction and at the fourth pitch, which wider than the second pitch, in the X direction on the third transfer substrate 206. The third pitch and the fourth pitch can be the pitch of the LED chips on the circuit board constituting a display.

In the fifth embodiment, the second transfer substrate rotation step is performed, and as shown in FIG. 20, the third transfer step is performed with the second transfer substrate 4 disposed vertically and the third transfer substrate 206 disposed horizontally, but this is not necessarily the only option, and changes can be made as needed according to the device or the like. For instance, the configuration may be such that the second transfer substrate rotation step is not performed, the second transfer substrate 4 is left in its horizontal disposition, the longitudinal direction of the linear laser light is rotated by 90°, and the third transfer substrate disposition step and the third transfer step are formed with the third transfer substrate 206 is disposed vertically. That is, the orientation of the second transfer substrate 4 may be rotated by 90° with respect to the longitudinal direction of the linear laser light.

Also, the third transfer step is performed in a vacuum as mentioned above. Performing the third transfer step in a vacuum prevents the LED chips 2, which have been separated from the second transfer substrate 4 and urged, from being transferred to the wrong position on the third transfer substrate 206 due to air resistance. In order to further prevent positional deviation, it is preferable for the gap between the second transfer substrate 4 and the third transfer substrate 206 to be as narrow as possible. In the fifth embodiment, the distance is set by adding a slight clearance to the height of the LED chips 2.

A transfer layer (not shown) is provided on the surface of the third transfer substrate 206. The LED chips 2 separated from the second transfer substrate 4 are transferred to the transfer layer provided on the surface of the third transfer substrate 206 by the urging force. Here, as described above, the transfer layer is adhesive at ordinary temperature, is solidified by heat or ultraviolet light, and decomposes and generates gas upon irradiation with a laser light. In other words, the transfer layer of the second transfer substrate 4 is decomposed by the laser light and generates a gas that produces an urging force, and after the LED chips 2 have been urged toward the transfer layer of the third transfer substrate 206 having adhesiveness and landed there, the transfer layer of the third transfer substrate 206 is solidified by the heat of the LED chips 2, and the LED chips 2 are held in place. If the heat of the LED chips 2 is too low, the transfer layer may be heated after the LED chips 2 have landed.

Next, a thermocompression bonding step is performed to join the second surface side of the LED chips 2, the first surface side of which is held on the third transfer substrate 206, to the circuit board 205. That is, as shown in FIG. 21, the circuit board 205 is positioned and fixed to the transfer-target substrate holder 55, and bumps on the second surface side of the LED chips 2, the first surface side of which is held by the third transfer substrate 206, are positioned and overlapped so as to face the electrodes of this circuit board 205. The third transfer substrate 206, the LED chips 2, and the circuit board 205 are pressed while being heated by the thermocompression bonding head 262 on the opposite side from the side of the third transfer substrate 206 where the LED chips 2 are held, and the transfer-target substrate holder 55 is heated. At this point, the heating temperatures of the thermocompression bonding head 262 and the transfer-target substrate holder 55 are controlled so as to be the same temperature, so that there will be no deviation in the mounting position due to the influence of thermal expansion or contraction. This temperature is preferably about 150° C. The bumps on the second surface of the LED chips 2 are facing the circuit board 205 side, and as a result, they are joined to the electrodes of the circuit board 205.

Finally, the third transfer substrate removal step is performed to remove the third transfer substrate 206 from the LED chips 2, thus completing the mounting. That is, as shown in FIG. 22, the third transfer substrate 206 is irradiated with the laser light 51, consisting of an excimer laser, in a linear shape, and either the third transfer substrate 206 and the circuit board 205, or the linear laser light 51 are/is moved relatively in the X direction to irradiate the entire third transfer substrate 206 with laser light. The adhesive strength of the transfer layer is reduced, and the third transfer substrate 206 is removed. In this removal, the third transfer substrate 206 can be held to and removed by the thermocompression bonding head 262. The bumps on the second surface of the LED chips 2 are securely joined to the circuit board 205, and the mounting is complete.

This allows the LED chips 2 to be mounted at the desired pitch on the circuit board 205. In particular, in the fifth embodiment, if the LED chips 2 are joined to the circuit board 205 in the thermocompression bonding step, and then the third transfer substrate 206 holding the LED chips 2 is removed, this prevents the LED chips 2 from being transferred to the wrong position, so very accurate mounting can be accomplished.

In the fifth embodiment, the third transfer substrate 206 is irradiated with the laser light 51 to reduce the adhesive strength of the transfer layer and remove the third transfer substrate 206, but this is not necessarily the only option, and changes can be made as needed. For instance, the transfer layer of the third transfer substrate 206 can be one whose adhesive strength is reduced by heating, and the configuration may be such that when the thermocompression bonding head 262 heats the third transfer substrate 206 in the thermocompression bonding step, the adhesive strength of the transfer layer of the third transfer substrate 206 is reduced by this heating, and in the third transfer substrate removal step, the third transfer substrate 206 is held and removed by the thermocompression bonding head 262. In this case, the third transfer substrate 206 need not be heated until the thermocompression bonding step.

Performing the third transfer step, the thermocompression bonding step, and the third transfer substrate removal step causes the LED chips 2 to be arranged on the circuit board 205 in the X direction at a fourth pitch that is wider than the second pitch and in the Y direction at a third pitch that is wider than the first pitch. The circuit board 205 or the second transfer substrate 4 is shifted in the Y direction by the first pitch, that is, by a distance corresponding to at least the length of the LED chips 2 in the Y direction, and the third transfer step, the thermocompression bonding step, and the third transfer substrate removal step are performed again, allowing a second type of LED chips 2 to be arranged in the Y direction in a line shape. That is, the third transfer step, the thermocompression bonding step, and the third transfer substrate removal step are performed again so that new LED chips are arranged between the LED chips in the longitudinal direction of the linear laser light already transferred to the circuit board 205, which allows a second type of LED chips 2 to be arranged in a linear shape in the Y direction. Furthermore, similarly performing the third transfer step, the thermocompression bonding step, and the third transfer substrate removal step for a third time allows a third type of LED chips 2 to be arranged in one line in the Y direction.

Here, if the first speed and the second speed in the second transfer step are set so that the third pitch is three times the first pitch, then three types of LED chips 2 can be arranged, thus forming an array with substantially no gaps in the Y direction. If the first type of LED chips 2 are red LED chips 2 (R), the second type of LED chips 2 are green LED chips 2 (G), and the third type of LED chips 2 are blue LED chips 2 (B), then red, green, and blue LED chips 2 can be arranged without any gap in between them.

Mounting Device

The mounting device 250 in the fifth embodiment of the present invention has the same configuration as the mounting device 150 described with reference to FIG. 9, but differs from the mounting device 150 in that the transfer-target substrate holder 55 has a heating mechanism 55*a* (see FIG. 21), and comprises a thermocompression bonding head 262 (see FIG. 21) capable of pressurizing and heating the LED chips, in order to perform the above-mentioned thermocompression bonding step and the third transfer substrate removal step. In the fifth embodiment, the steps from the first-A transfer step to the third transfer substrate removal step can be performed by a single mounting device 250. In the illustrated embodiment, the heating mechanism 55*a* includes a heating wire or coil, as shown in FIG. 21. Also, in the illustrated embodiment, the thermocompression bonding head 262 includes a heating wire or coil.

In the above-mentioned thermocompression bonding step, the controller 162 controls heating so that the temperature of the thermocompression bonding head 262 and the temperature of the transfer-target substrate holder 55 are the same, so that the third transfer substrate 206 is still held while the LED chips 2 and the circuit board 205 are pressed. The heating temperature is preferably about 150° C. In the third transfer substrate removal step, after the entire surface of the third transfer substrate 206 is irradiated with the laser light 51 to reduce the adhesive strength of the transfer layer, the thermocompression bonding head 262 holds the third transfer substrate 206, and separates it from the LED chips 2, thereby removing it.

In the fifth embodiment, the configuration is such that the steps are performed by a single mounting device 150, but this is not necessarily the only option, and changes can be made as needed. For instance, three mounting devices 250 may be arranged so that the first-A transfer step, the first-B transfer step, the second transfer step, the third transfer step, and the thermal transfer step/third transfer substrate removal step are each performed by a separate mounting device 250. In this case, each of the mounting devices 250 may be configured to dispose or rotate the respective substrates by means of a conveyor (not shown) constituted by a robot or the like. Also, the configuration may be such that only the thermal transfer step/third transfer substrate removal step is performed by a separate mounting device 250.

Thus, the fifth embodiment is a mounting method for mounting diced LED chips, the first surface of which is held on a carrier substrate, on a circuit board, the method comprising:

a first-A transfer step of separating the LED chips from the carrier substrate, transferring a second surface side on the opposite side from the first surface of the LED chips to a first-A transfer substrate, and holding the LED chips there;

a first-B transfer step of separating the LED chips from the first-A transfer substrate, transferring the first surface side of the LED chips to a first-B transfer substrate, and holding the LED chips there;

a second transfer substrate disposition step of disposing a second transfer substrate so as to face, across a gap, the second surface of the LED chips, the first surface of which is held on the first-B transfer substrate;

a second transfer step of irradiating the first-B transfer substrate with a linear laser light to separate the plurality of the LED chips in one line from the first-B transfer substrate and urge the LED chips toward the second transfer substrate, moving the first-B transfer substrate and the second transfer substrate relative to each other at different speeds and in a direction perpendicular to the linear laser light, and thereby transferring the second surface side of the LED chips to the second transfer substrate;

a second transfer substrate rotation step of disposing the second transfer substrate by rotating the second transfer substrate 90° around its normal line with respect to the linear laser light;

a third transfer substrate disposition step of disposing a third transfer substrate so as to face, across a gap, the first surface of the LED chips, the second surface of which is held on the second transfer substrate;

a third transfer step of irradiating the second transfer substrate with a linear laser light to separate the plurality of LED chips in one line from the second transfer substrate and urge the LED chips toward the third transfer substrate, moving the second transfer substrate and the third transfer substrate relative to each other at different speeds and in a direction perpendicular to the linear laser light, and thereby transferring the first surface side of the LED chips to the third transfer substrate;

a thermocompression bonding step of placing bumps on a second surface of the LED chips, the first surface of which is held on the third transfer substrate, opposite the electrodes of the circuit board and subjecting them to thermocompression bonding; and a third transfer substrate removal step of separating the first surface of the LED chips from the third transfer substrate and removing the third transfer substrate, wherein at least the second transfer step and the third transfer step are performed in a vacuum. This mounting method eliminates the influence of air resistance during transfer and allows the LED chips to be transferred and mounted very accurately. Also, performing the thermocompression bonding step allows the LED chips to be securely joined to the circuit board, and affords very accurate mounting.

In the fifth embodiment, a thermocompression bonding head is provided for the thermocompression bonding of the LED chips to the circuit board, which is held on the transfer-target substrate holder, the transfer-target substrate holder is provided with a heating mechanism for heating the held transfer-target substrate or the circuit board, and the controller is configured to control heating so that the thermocompression bonding head and the transfer-target substrate holder are the same temperature, so that the LED chips are thermocompression bonded to the circuit board. This allows for very accurate mounting, without any deviation in the mounting position caused by the influence of thermal expansion or contraction.

The transfer method, mounting method, transfer device, and mounting device in the present invention can be widely used in fields in which LED chips are transferred and mounted very accurately by eliminating the influence of air resistance during transfer.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A transfer method for transferring LED chips, a first surface of which is held on a transfer substrate, on a transfer-target substrate, the transfer method comprising:
    disposing the transfer-target substrate such that the transfer-target substrate faces, across a gap, a second surface of the LED chips on an opposite side from the first surface of the LED chips; and
    transferring the LED chips on the transfer-target substrate by irradiating the transfer substrate with a laser light to separate the LED chips from the transfer substrate and by urging the LED chips toward the transfer-target substrate,
    at least the transferring of the LED chips to the transfer-target substrate being executed in a vacuum environment.

2. A mounting method for mounting diced LED chips, a first surface of which is held on a carrier substrate, on a circuit board, the mounting method comprising:
    transferring the LED chips to a first transfer substrate by separating the LED chips from the carrier substrate such that a second surface of the LED chips on an opposite side from the first surface of the LED chips is held on the first transfer substrate;
    disposing a second transfer substrate such that the second transfer substrate faces, across a gap, the first surface of the LED chips while the second surface of the LED chips is held on the first transfer substrate;
    transferring a first surface side of the LED chips to the second transfer substrate by irradiating the first transfer substrate with a linear laser light to separate the LED chips line by line from the first transfer substrate, by urging the LED chips toward the second transfer substrate, and by moving the first transfer substrate and the second transfer substrate relative to each other at different speeds and in a direction perpendicular to the linear laser light;
    disposing the second transfer substrate by rotating the second transfer substrate by 90° around a normal line of the second transfer substrate with respect to the linear laser light;
    disposing the circuit board such that the circuit board faces, across a gap, the second surface of the LED chips while the first surface of the LED chips is held on the second transfer substrate; and
    transferring a second surface side of the LED chips to the circuit board such that bumps on the LED chips are joined to electrodes on the circuit board by irradiating the second transfer substrate with a linear laser light to separate the LED chips line by line from the second transfer substrate, urging the LED chips toward the circuit board, and by moving the second transfer substrate and the circuit board relative to each other at different speeds and in a direction perpendicular to the linear laser light,
    at least the transferring of the first surface side of the LED chips to the second transfer substrate and the transferring of the second surface side of the LED chips to the circuit board being executed in a vacuum environment.

3. The mounting method according to claim 2, wherein the transferring of the second surface side of the LED chips to the circuit board is executed again such that new LED chips are disposed between the LED chips in a longitudinal direction of the linear laser light that have been already transferred to the circuit board in the previous transferring of the second surface side of the LED chips to the circuit board.

4. A mounting method for mounting diced LED chips, a first surface of which is held on a carrier substrate, on a circuit board, the mounting method comprising:
    transferring the LED chips to a first-A transfer substrate by separating the LED chips from the carrier substrate such that a second surface of the LED chips on an opposite side from the first surface of the LED chips is held on the first-A transfer substrate;
    transferring a first surface side of the LED chips to a first-B transfer substrate by separating the LED chips from the first-A transfer substrate such that the first surface side of the LED chips is held on the first-B transfer substrate;
    disposing a second transfer substrate such that the second transfer substrate faces, across a gap, the second surface of the LED chips while the first surface of the LED chips is held on the first-B transfer substrate;
    transferring a second surface side of the LED chips to the second transfer substrate by irradiating the first-B transfer substrate with a linear laser light to separate the LED chips line by line from the first-B transfer substrate, by urging the LED chips toward the second transfer substrate, and by moving the first-B transfer substrate and the second transfer substrate relative to each other at different speeds and in a direction perpendicular to the linear laser light;

disposing the second transfer substrate by rotating the second transfer substrate by 90° around a normal line of the second transfer substrate with respect to the linear laser light;

disposing a third transfer substrate such that the third transfer substrate faces, across a gap, the first surface of the LED chips while the second surface of the LED chips is held on the second transfer substrate;

transferring the first surface side of the LED chips to the third transfer substrate by irradiating the second transfer substrate with a linear laser light to separate the LED chips line by line from the second transfer substrate, by urging the LED chips toward the third transfer substrate, and by moving the second transfer substrate and the third transfer substrate relative to each other at different speeds and in a direction perpendicular to the linear laser light;

performing thermocompression bonding between bumps on the second surface of the LED chips and electrodes of the circuit board after disposing the bumps of the LED chips to face the electrodes of the circuit board while the first surface of the LED chips is held on the third transfer substrate; and removing the third transfer substrate by separating the first surface of the LED chips from the third transfer substrate, at least the transferring of the second surface side of the LED chips to the second transfer substrate and the transferring of the first surface side of the LED chips to the third transfer substrate being executed in a vacuum environment.

5. A transfer device for transferring LED chips held on a transfer substrate to a transfer-target substrate, the transfer device comprising:

an evacuation component configured to put an interior of the transfer device under a vacuum;

a laser light emitter configured to irradiate the transfer substrate with a laser light;

a transfer substrate holder configured to hold the transfer substrate, the transfer substrate holder being movable in a first direction;

a transfer-target substrate holder configured to hold the transfer-target substrate such that the transfer-target substrate faces, across a gap, the LED chips that is held on the transfer substrate, the transfer-target substrate holder being movable in at least the first direction; and a controller configured to control the laser light emitter, the transfer substrate holder, and the transfer-target substrate holder such that the LED chips are transferred to the transfer-target substrate by separating the LED chips from the transfer substrate and by urging the LED chips toward the transfer-target substrate.

6. A mounting device for mounting LED chips on a circuit board, the mounting device comprising:

an evacuation component configured to put an interior of the mounting device under a vacuum;

a laser light emitter configured to irradiate a transfer substrate on which the LED chips are arranged with a linear laser light;

a transfer substrate holder configured to hold the transfer substrate, the transfer substrate holder being movable in a first direction;

a transfer-target substrate holder configured to hold a transfer-target substrate or the circuit board such that the transfer-target substrate or the circuit board faces, across a gap, the LED chips held on the transfer substrate, the transfer-target substrate holder being movable in at least the first direction; and a controller configured to control the laser light emitter, the transfer substrate holder, and the transfer-target substrate holder such that the LED chips are transferred to the transfer-target substrate or the circuit board by moving the transfer substrate and the transfer-target substrate or the circuit board relative to each other at different speeds in a direction perpendicular to the linear laser light, by separating a line of the LED chips that corresponds to the linear laser light, and by urging the line of the LED chips toward the transfer-target substrate or the circuit board.

7. The mounting device according to claim 6, further comprising a thermocompression bonding head configured to perform thermocompression bonding between the LED chips and the circuit board that is held on the transfer-target substrate holder, the transfer-target substrate holder having a heating mechanism that is configured to heat the circuit board or the transfer-target substrate that is held by the transfer-target substrate, and the controller being configured to control the thermocompression bonding such that the thermocompression bonding between the LED chips and the circuit board is performed by heating the thermocompression bonding head and the transfer-target substrate holder to the same temperature.

* * * * *